US012745517B2

(12) United States Patent
Jeon et al.

(10) Patent No.: US 12,745,517 B2
(45) Date of Patent: Sep. 22, 2026

(54) DISPLAY PANEL WITH A PERIPHERAL AREA INCLUDING A PIXEL CIRCUIT, AND DISPLAY APPARATUS INCLUDING THE SAME

(71) Applicant: Samsung Display Co., Ltd., Yongin-Si (KR)

(72) Inventors: Joohee Jeon, Yongin-si (KR); Donghwan Shim, Yongin-si (KR); Junki Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1105 days.

(21) Appl. No.: 17/690,973

(22) Filed: Mar. 9, 2022

(65) Prior Publication Data

US 2022/0399429 A1 Dec. 15, 2022

(30) Foreign Application Priority Data

Jun. 9, 2021 (KR) ........................ 10-2021-0074975

(51) Int. Cl.
*H10K 59/131* (2023.01)
*H10K 59/124* (2023.01)
*H10K 59/65* (2023.01)
*H10K 59/88* (2023.01)

(52) U.S. Cl.
CPC ......... *H10K 59/131* (2023.02); *H10K 59/124* (2023.02); *H10K 59/65* (2023.02); *H10K 59/88* (2023.02)

(58) Field of Classification Search
CPC ...... H10K 59/131; H10K 59/65; H10K 59/88; H10K 59/124
See application file for complete search history.

(56) References Cited

U.S. PATENT DOCUMENTS

2017/0162637 A1* 6/2017 Choi ........................ H01L 21/28
2018/0005568 A1* 1/2018 Kim ..................... H10K 59/122
2018/0082630 A1* 3/2018 Kim ........................ H10K 59/88
2018/0129106 A1* 5/2018 Gao .................... G02F 1/13781
2018/0145093 A1* 5/2018 Xi ........................ H10D 30/673
(Continued)

FOREIGN PATENT DOCUMENTS

CN 111969027 A 11/2020
CN 112133250 A 12/2020
(Continued)

*Primary Examiner* — Lex H Malsawma
(74) *Attorney, Agent, or Firm* — Innovation Counsel LLP

(57) ABSTRACT

A display apparatus includes a display panel including a first area in which a first display element and a first pixel circuit are arranged, a second area in which a second display element is arranged, and a peripheral area in which a pixel circuit unit including a second pixel circuit is arranged; and a component arranged below the display panel to correspond to the second area, wherein the display panel includes a substrate; an organic insulating layer that is arranged between the first display element and the first pixel circuit, and extends to the peripheral area; and a valley portion that is provided as an opening in the organic insulating layer in the peripheral area, and at least partially surrounds the first area, wherein the valley portion includes a first valley and a second valley that are apart from each other with the pixel circuit unit therebetween.

25 Claims, 12 Drawing Sheets

(56) References Cited

U.S. PATENT DOCUMENTS

2019/0130840 A1* 5/2019 Park .................... G09G 3/3266
2019/0157630 A1* 5/2019 Kwon .................. H10K 50/805
2019/0296099 A1* 9/2019 Lee ...................... H10K 59/131
2019/0305072 A1* 10/2019 Park ....................... H10K 50/82
2020/0083306 A1* 3/2020 Choi .................. H10K 59/8731
2020/0161398 A1* 5/2020 Bang .................. H10K 59/8722
2020/0168685 A1* 5/2020 Bang ..................... G06F 3/0412
2020/0194532 A1 6/2020 Lee et al.
2020/0203653 A1* 6/2020 Um ...................... H10D 86/443
2020/0294448 A1* 9/2020 Heo ..................... G09G 3/3275
2020/0312926 A1 10/2020 Bae et al.
2020/0394959 A1 12/2020 Lou et al.
2021/0005683 A1* 1/2021 Sung .................. H10K 50/8426
2021/0012706 A1* 1/2021 Yang ........................ G09G 3/32
2021/0126224 A1 4/2021 Lee et al.
2021/0134928 A1* 5/2021 Bang .................... H10K 59/131

FOREIGN PATENT DOCUMENTS

KR 10-2020-0072928 A 6/2020
KR 10-2020-0115888 A 10/2020
KR 10-2021-0052636 A 5/2021

* cited by examiner

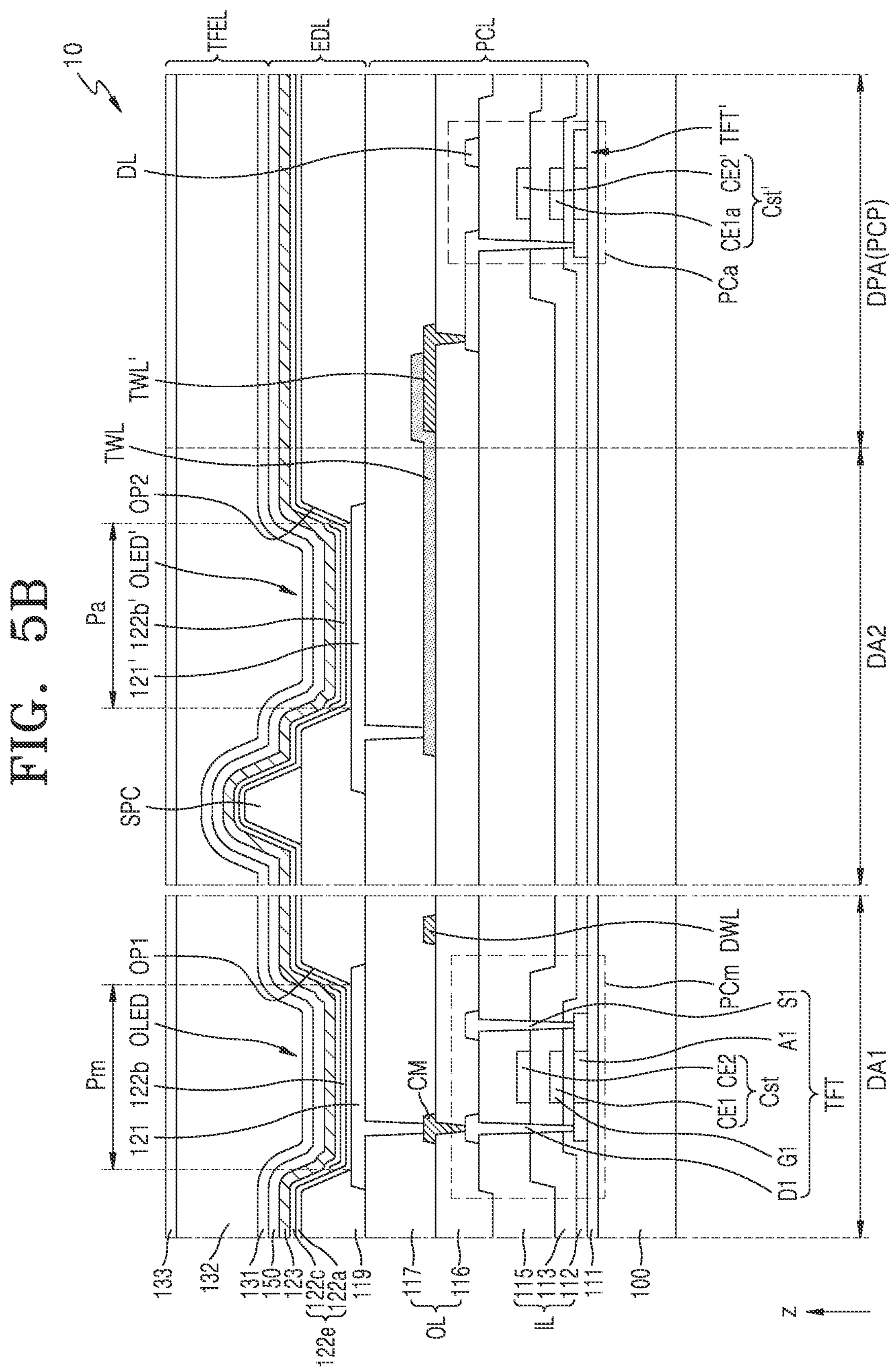

FIG. 9

DAM
dam1
dam2
dam3
117c
133
131
II'
CM3
11b
DPA
WL
DAM'
120'
119'
DL
TFT'
CE2'
CE1a
Cst'
PCa
POP
TWL'
TWL
OP2
OLED'
122b'
121'
Pa
SPC
H1
DA2
TFEL
133
132
131
150
123
122e
122c
122a
119
OL
117
116
IL
115
113
112
111
100
II DAM
dam1
dam2
dam3
117c
133
131
II'
FWL
CM3
11b
DPA
BWL
120a
119a
117a
dam1
DL
TFT'
CE2'
CE1a
Cst'
PCa
PCP
TWL
TWL'
OP2
OLED'
122b'
121'
Pa
DA2
SPC
H1
133
132
131
150
123
122c
122a
119
117
116
115
113
112
111
100
II
TFEL
122e
OL
IL

DISPLAY PANEL WITH A PERIPHERAL AREA INCLUDING A PIXEL CIRCUIT, AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0074975, filed on Jun. 9, 2021, in the Korean Intellectual Property Office, the disclosure of which is incorporated by reference herein in its entirety.

BACKGROUND

1. Field

One or more embodiments relate to a display panel and a display apparatus including the display panel, and more particularly, to a display panel with an extended display area that allows an image to be displayed even in an area in which a component that is an electronic element is arranged, and a display apparatus including the display panel.

2. Description of the Related Art

As display apparatuses have become thinner and more lightweight, the usage of display apparatuses has steadily diversified and expanded.

As display apparatuses are used for various purposes, various methods are used for designing the shapes thereof, and the number of functions that may be combined with or linked to display apparatuses have increased.

SUMMARY

One or more embodiments include a display panel with an extended display area that allows an image to be displayed even in an area in which a component that is an electronic element is arranged, and a display apparatus including the display panel. However, these objectives are examples and do not limit the scope of the present disclosure.

Additional aspects will be set forth in part in the description which follows and, in part, will be apparent from the description, or may be learned by practice of the presented embodiments of the present disclosure.

A display apparatus includes a display panel including a first area in which a first display element and a first pixel circuit are arranged, a second area in which a second display element is arranged, and a peripheral area in which a pixel circuit unit including a second pixel circuit is arranged, and a component arranged below the display panel to correspond to the second area, wherein the display panel includes a substrate, an organic insulating layer that is arranged between the first display element and the first pixel circuit, and extends to the peripheral area, and a valley portion that is provided as an opening in the organic insulating layer in the peripheral area, and at least partially surrounds the first area, wherein the valley portion includes a first valley and a second valley that are apart from each other with the pixel circuit unit therebetween.

The display apparatus may further include a dam portion that is arranged in the peripheral area, and protrudes from an upper surface of the substrate, wherein the valley portion may be arranged between the first area and the dam portion.

The display apparatus may further include an inner dam at least partially overlapping the second pixel circuit, wherein the inner dam may be arranged on the organic insulating layer.

The display apparatus may further include a dam portion arranged outside of the valley portion, a fan-out line overlapping the dam portion, and a bridge line that is arranged on a different layer from a layer on which the fan-out line is arranged, and connects the fan-out line and the second pixel circuit to each other.

The display apparatus may further include a transparent connection line that connects the second display element and the second pixel circuit to each other, wherein the organic insulating layer may be provided by stacking a first organic insulating layer and a second organic insulating layer, and the transparent connection line may be arranged between the first organic insulating layer and the second organic insulating layer.

The display apparatus may further include an inorganic insulating layer between the substrate and the organic insulating layer, wherein the inorganic insulating layer may include an opening corresponding to the second area, the opening being filled with the organic insulating layer.

The component may include an imaging device.

According to an embodiment, a display panel includes a substrate including a display area in which an image is generated, and a peripheral area arranged in a vicinity of the display area, a first display element arranged in a first area of the display area, and a first pixel circuit connected to the first display element, a second display element arranged in a second area of the display area, a pixel circuit unit in which a second pixel circuit connected to the second display element in the peripheral area is arranged, an organic insulating layer that is arranged between the first display element and the first pixel circuit, and extends to the peripheral area, and a valley portion that is provided as an opening in the organic insulating layer in the peripheral area, and at least partially surrounds the display area in a plan view, wherein the valley portion includes a first valley and a second valley that are apart from each other with the pixel circuit unit between.

The display panel may further include a dam portion that is arranged in the peripheral area, and protrudes from an upper surface of the substrate, wherein the valley portion may be arranged between the first area and the dam portion.

The display panel may further include a common voltage driving line that is arranged in the peripheral area, and at least partially surrounds the display area, wherein the dam portion may include a first dam overlapping the common voltage driving line.

The common voltage driving line may include a first common voltage driving line and a second common voltage driving line that are apart from each other with the pixel circuit unit therebetween.

The display panel may further include a driving voltage supply line that is arranged between the first common voltage driving line and the second common voltage driving line at one side of the pixel circuit unit.

The first dam may be arranged to cover one edge of the driving voltage supply line.

The dam portion may include a second dam apart from the first dam, and the second dam may be arranged to cover an edge of the common voltage driving line.

The dam portion may include a third dam outside of the second dam, and a height of the third dam may be less than a height of the second dam.

The organic insulating layer may be provided by stacking a first organic insulating layer and a second organic insulating layer, and the pixel circuit unit may include a line between the first organic insulating layer and the second organic insulating layer.

The display panel may further include an inner dam at least partially overlapping the pixel circuit unit, wherein the inner dam may be arranged on the organic insulating layer.

The display panel may further include a fan-out line overlapping the dam portion, and a bridge line that is arranged on a different layer from a layer on which the fan-out line is arranged, and connects the fan-out line and the second pixel circuit to each other.

The display panel may further include a transparent connection line that connects the second display element and the second pixel circuit to each other, wherein the organic insulating layer may be provided by stacking a first organic insulating layer and a second organic insulating layer, and the transparent connection line may be arranged between the first organic insulating layer and the second organic insulating layer.

The display panel may further include an inorganic insulating layer between the substrate and the organic insulating layer, wherein the inorganic insulating layer may include an opening corresponding to the second area, the opening being filled with the organic insulating layer.

According to an embodiment, a display panel includes a substrate including a display area in which an image is implemented, and a peripheral area arranged in a vicinity of the display area, a first display element arranged in a first area of the display area, and a first pixel circuit connected to the first display element, an organic insulating layer that is arranged between the first display element and the first pixel circuit, and extends to the peripheral area, a second display element arranged in a second area of the display area, a pixel circuit unit which is arranged in the peripheral area, and in which a second pixel circuit connected to the second display element is arranged, a dam portion that is arranged in the peripheral area, and protrudes from an upper surface of the substrate, and a valley portion provided as an opening of the organic insulating layer between an edge of the display area and the dam portion, wherein the organic insulating layer is continuously arranged in at least a partial area between the edge of the display area and the dam portion.

The display panel may further include a common voltage driving line that is arranged in the peripheral area, and at least partially surrounds the display area, wherein the dam portion may include a first dam overlapping the common voltage driving line.

The common voltage driving line may include a first common voltage driving line and a second common voltage driving line that are apart from each other with the pixel circuit unit therebetween.

The display panel may further include a driving voltage supply line that is arranged between the first common voltage driving line and the second common voltage driving line at one side of the pixel circuit unit.

The first dam may be arranged to cover one edge of the driving voltage supply line.

BRIEF DESCRIPTION OF THE DRAWINGS

The above and other aspects, features, and advantages of certain embodiments will be more apparent from the following description taken in conjunction with the accompanying drawings, in which:

FIG. 5B is a cross-sectional view schematically illustrating a portion of a display panel according to an embodiment;

FIG. 9 is a cross-sectional view of the display panel in FIG. 7 taken along line II-II' in FIG. 7;

DETAILED DESCRIPTION

Figure 1:
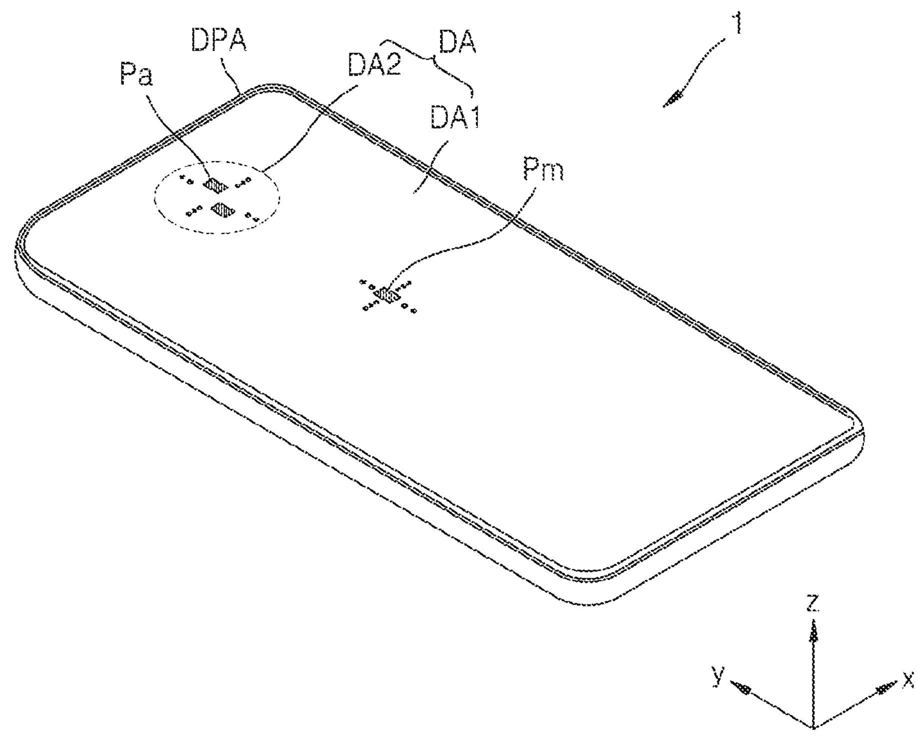
FIG. 1 is a perspective view schematically illustrating a display apparatus according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

It will be understood that when a layer, region, or element is referred to as being "formed on" another layer, area, or element, it can be directly or indirectly formed on the other layer, region, or element. That is, for example, one or more intervening layers, regions, or elements may be present therebetween. In the drawings, sizes of components in the drawings may be exaggerated or reduced for convenience of explanation. In other words, because sizes and thicknesses of components in the drawings are arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating a display apparatus 1 according to an embodiment.

Referring to FIG. 1, the display apparatus 1 includes a display area DA and a peripheral area DPA outside of the display area DA. The display area DA may include a first area DA1 and a second area DA2. The first area DA1 may be arranged to at least partially surround the second area DA2. The first area DA1 may include a main display area, and the second area DA2 may include a component area in which a component is arranged, and an auxiliary display area. In other words, the first area DA1 and the second area DA2 may display an image individually or together. The peripheral area DPA may include a kind of non-display area with no display elements arranged therein. The display area DA may be entirely surrounded by the peripheral area DPA.

FIG. 1 shows that the first area DA1 has only one second area DA2 in which a component is arranged. In another embodiment, the display apparatus 1 may have two or more second areas DA2, and shapes and sizes of the second areas DA2 may be different from each other. When viewed from a direction approximately perpendicular to an upper surface of the display apparatus 1, the second area DA2 may have various shapes such as a circular shape, an oval shape, a polygonal shape such as a quadrilateral or the like, a star shape, or a diamond shape. In addition, in FIG. 1, when viewed from a direction approximately perpendicular to the upper surface of the display apparatus 1, the second area DA2 is arranged at a center of an upper side (in a+y direction) of the first area DA1 having an approximately quadrilateral shape. However, the second area DA2 may be arranged at one side, for example, an upper right side or an upper left side, of the first area DA1 that is a quadrilateral.

The display apparatus 1 may provide an image by using a plurality of first pixels Pm arranged in the first area DA1 and a plurality of second pixels Pa arranged in the second area DA2.

The plurality of second pixels Pa may be arranged in the second area DA2. The plurality of second pixels Pa may emit light and provide an image. An image displayed in the second area DA2 is an auxiliary image, and may have a lower resolution than an image displayed in the first area DA1.

A component 40 (see FIG. 2), which is an electronic element, may be arranged below the display panel 10 in the second area DA2. The component 40 may be a sensor, for example, an illumination sensor, a proximity sensor, and an iris sensor. The component 40 may include an optical sensor using light. The component 40 may include an imaging device as a camera using infrared or visible light. In some embodiments, the component 40 may include a solar cell and a flash. In some embodiments, the component 40 may have a function of receiving sound. To keep restrictions on functions of the component 40 to a minimum, a second pixel circuit for driving the second pixel Pa arranged in the second area DA2 may not be arranged in the second area DA2, but may be arranged in the peripheral area DPA.

In a case of a display panel and a display apparatus including the display panel, according to an embodiment, when light passes through the second area DA2, a light transmittance may be about 10% or more, for example, about 40% or more, about 25% or more, about 50% or more, about 85% or more, or about 90% or more.

Figure 2:
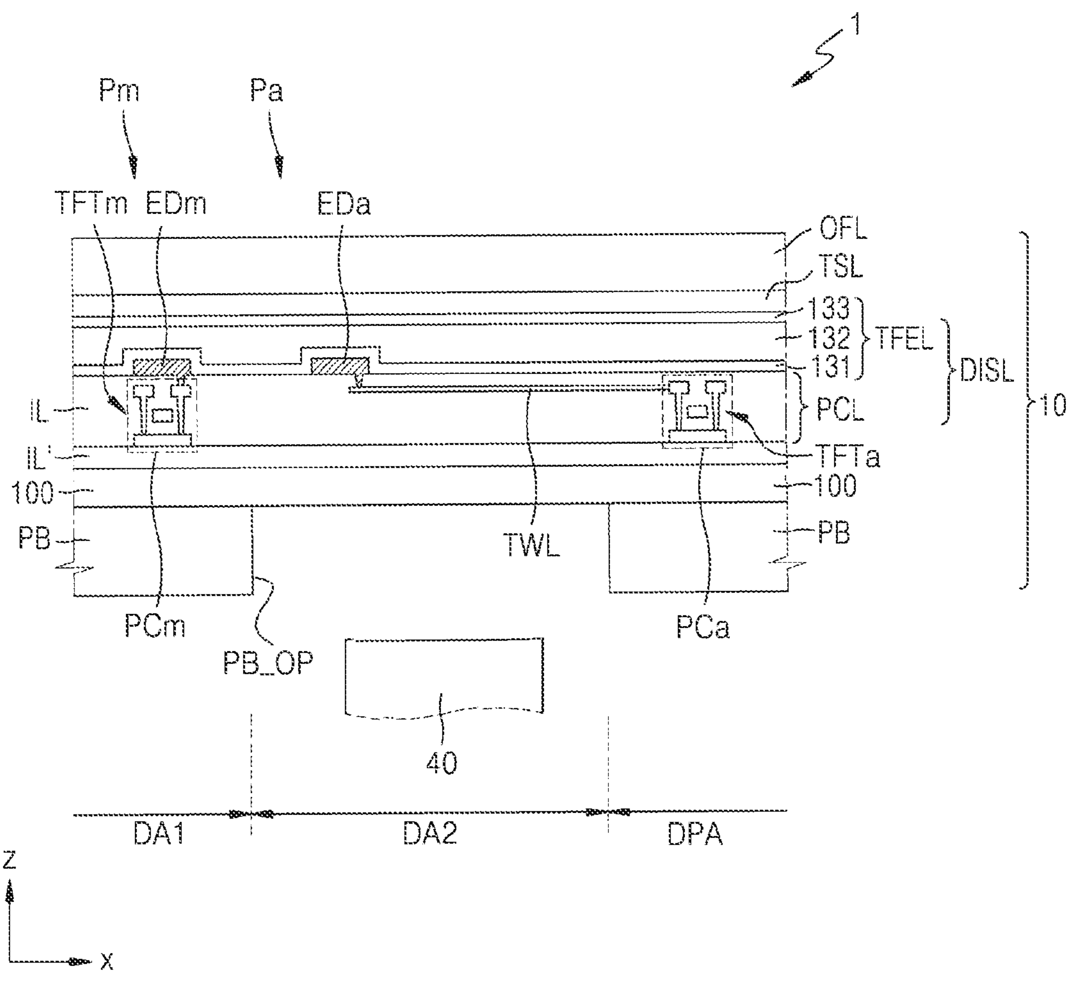
FIG. 2 is a cross-sectional view schematically illustrating a portion of a display apparatus according to an embodiment.

FIG. 2 is a cross-sectional view schematically illustrating a portion of a display apparatus 1 according to an embodiment.

Referring to FIG. 2, the display apparatus 1 may include a display panel 10 and a component 40 overlapping the display panel 10. A cover window (not shown) for protecting the display panel 10 may further be arranged above the display panel 10.

The display panel 10 may include a second area DA2 that overlaps the component 40, and a first area DA1 for displaying a main image. The display panel 10 may include a substrate 100, a display layer DISL arranged on the substrate 100, a touch screen layer TSL, an optical functional layer OFL, and a panel protection member PB arranged below the substrate 100.

The display layer DISL may include a circuit layer PCL including thin-film transistors TFTm and TFTa, and a display element layer including a light-emitting element (e.g., a first display element EDm and a second display element EDa) as a display element, and a thin-film encapsulation layer TFEL. Insulating layers IL and IL' may be arranged between the substrate 100 and the display layer DISL and within the display layer DISL, respectively.

The substrate 100 may include an insulating material such as glass, quartz, and a polymer resin. The substrate 100 may include a rigid substrate, or a flexible substrate that is bendable, foldable, or rollable.

A first pixel circuit PCm and the first display element EDm connected thereto may be arranged in the first area DA1 of the display panel 10. The first pixel circuit PCm includes at least one thin-film transistor TFTm, and may control emission by the first display element EDm. A first pixel Pm may be implemented by emission of the first display element EDm.

The second display element EDa may be arranged in the second area DA2 of the display panel 10 to implement the second pixel Pa. The second area DA2 is an auxiliary display area, and a resolution of the second area DA2 may be less than that of the first area DA1. In other words, a number per unit area of the second display elements EDa arranged in the second area DA2 may be less than a number per unit area of the first display elements EDm arranged in the first area DA1.

In the present embodiment, a second pixel circuit PCa for driving the second display element EDa may be arranged in the peripheral area DPA rather than the second area DA2. In other words, the second pixel circuit PCa may be arranged not to overlap the second display element EDa.

The second pixel circuit PCa may include at least one thin-film transistor TFTa, and may be electrically connected to the second display element EDa by a connection line TWL. The connection line TWL may include a transparent conductive material. The second pixel circuit PCa may control light emission of the second display element EDa. The second pixel Pa may be implemented by light emission of the second display element EDa.

In addition, the second area DA2 may include an area that light/sound emitted from the component 40 or light/sound incident on the component 40 transmits. Because only the second display element EDa, and the connection line TWL including a transparent conductive material are arranged in the second area DA2 and a number per area of the second display elements EDa arranged in the second area DA2 is less than a number per area of the first display elements EDm arranged in the first area DA1, a light transmittance of the second area DA2 may be high.

The first display element and the second display element EDa, which are display elements, may be covered with the thin-film encapsulation layer TFEL. In some embodiments, the thin-film encapsulation layer TFEL may include at least one inorganic encapsulation layer and at least one organic encapsulation layer, as shown in FIG. 2. In an embodiment, the thin-film encapsulation layer TFEL may include a first inorganic encapsulation layer 131, a second inorganic encapsulation layer 133, and an organic encapsulation layer 132 therebetween.

Each of the first inorganic encapsulation layer 131 and the second inorganic encapsulation layer 133 may include one or more inorganic insulating materials such as silicon oxide ($SiO_2$), silicon nitride ($SiN_X$), silicon oxynitride ($SiO_XN_y$), aluminum oxide ($Al_2O_3$), titanium oxide ($TiO_2$), tantalum oxide ($Ta_2O_5$), hafnium oxide ($HfO_2$), or zinc oxide (ZnO), and may be provided by chemical vapor deposition (CVD). The organic encapsulation layer 132 may include a polymer-based material. The polymer-based material may include a silicon-based resin, an acryl-based resin, an epoxy-based resin, polyimide, and polyethylene.

Each of the first inorganic encapsulation layer 131, the organic encapsulation layer 132, and the second inorganic encapsulation layer 133 may be integrally provided as a single body to cover the first area DA1 and the second area DA2.

The touch screen layer TSL may obtain coordinate information according to an external input, for example, a touch event. The touch screen layer TSL may include a touch electrode and touch lines connected to the touch electrode. The touch screen layer TSL may detect an external input by using a self-capacitance method or a mutual capacitance method.

The touch screen layer TSL may be provided on the thin-film encapsulation layer TFEL. In some embodiments, the touch screen layer TSL may be separately provided on a touch substrate and then, may be coupled onto the thin-film encapsulation layer TFEL through an adhesive layer such as an optically clear adhesive (OCA). In an embodiment, the touch screen layer TSL may be directly provided on the thin-film encapsulation layer TFEL, and in this case, an adhesive layer may not be between the touch screen layer TSL and the thin-film encapsulation layer TFEL.

The optical functional layer OFL may include an anti-reflection layer. The anti-reflection layer may reduce reflectivity of (external) light incident toward the display apparatus 1 from the outside. In some embodiments, the optical functional layer OFL may include a polarizing film. In some embodiments, the optical functional layer OFL may include a filter plate including a black matrix and color filters.

The panel protection member PB may be attached below the substrate 100 to support and protect the substrate 100. An opening PB_OP corresponding to the second area DA2 may be formed in the panel protection member PB. The opening PB_OP is to improve the light transmittance of the second area DA2. The panel protection member PB may include polyethylene terephthalate (PET) or polyimide (PI).

An area of the second area DA2 in the x direction may be greater than an area in which the component 40 is arranged. Accordingly, an area of the opening PB_OP provided in the panel protection member PB along the x direction may not be equal to an area of the second area DA2.

In addition, a plurality of components 40 may be arranged in the second area DA2. The plurality of components 40 may have different functions from one another. For example, the plurality of components 40 may include at least two of a camera (an imaging device), a solar cell, a flash, a proximity sensor, an illumination sensor, and an iris sensor.

Figure 3:
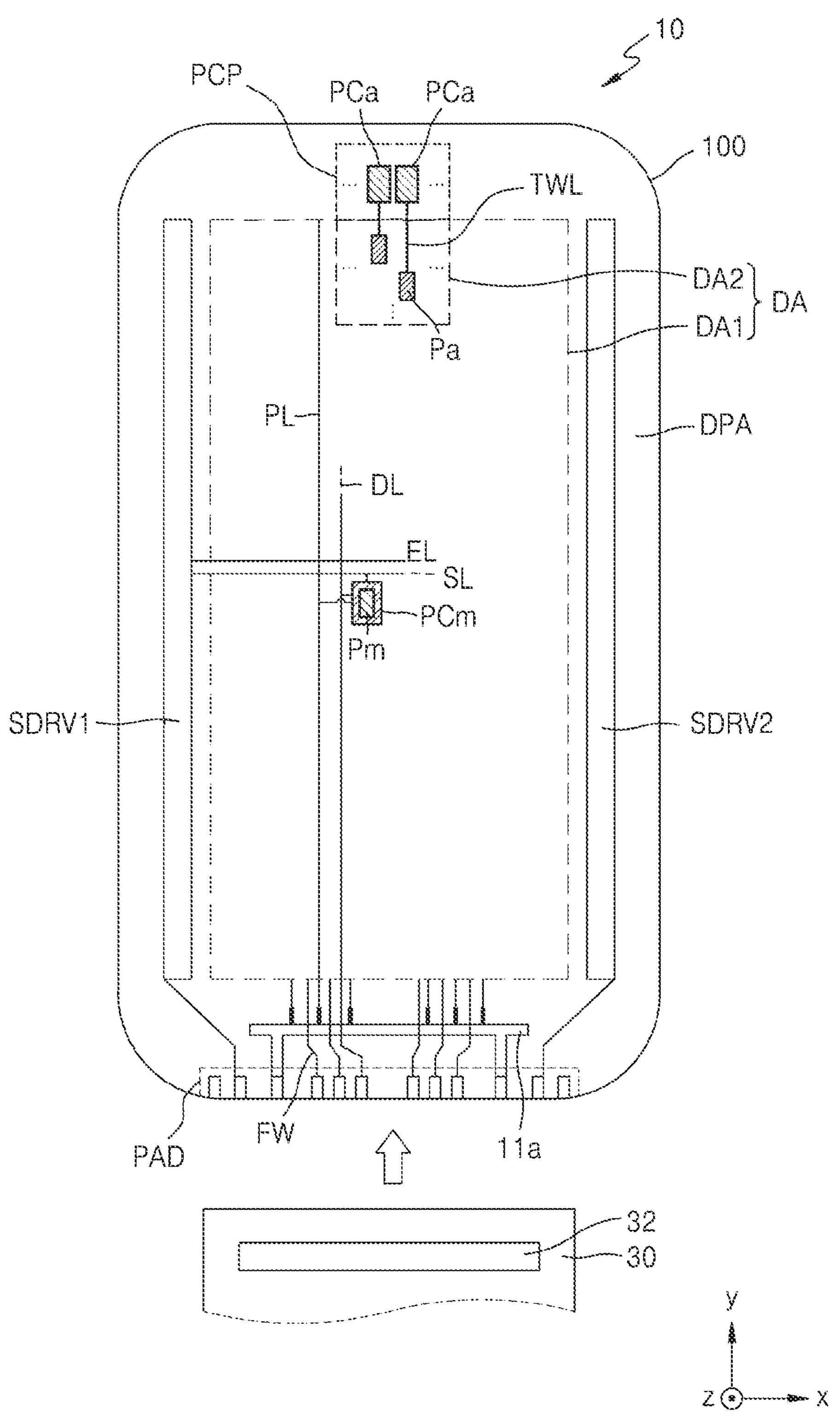
FIG. 3 is a plan view schematically illustrating a display panel that may be included in the display apparatus in FIG. 1, according to an embodiment.

FIG. 3 is a plan view schematically illustrating a display panel 10 that may be included in the display apparatus in FIG. 1, according to an embodiment.

Referring to FIG. 3, various elements of the display panel 10 are arranged on the substrate 100. The substrate 100 includes a display area DA and a peripheral area DPA surrounding the display area DA. The display area DA includes a first area DA1 in which a main image is displayed, and a second area DA2 in which an auxiliary image is displayed. The auxiliary image may provide one full image together with the main image, and may be an image independent from the main image. A pixel circuit unit PCP in which second pixel circuits PCa for driving second pixels Pa arranged in the second area DA2 are arranged may be provided in the peripheral area DPA.

A plurality of first pixels Pm may be arranged in the first area DA1. Each of the first pixels Pm may be implemented as a first display element such as an organic light-emitting diode. The first pixel circuit PCm for driving the first pixels Pm may be arranged in the first area DA1, and may overlap the first pixel Pm. Each of the first pixels Pm may emit, for example, red, green, blue, or white light. The first area DA1 is covered with a sealing member, and may be protected from an ambient air or moisture.

The second area DA2 may be located at one side of the first area DA1 as described above, or may be arranged within the display area DA and surrounded by the first area DA1. A plurality of second pixels Pa are arranged in the second area DA2. Each of the plurality of second pixels Pa may be implemented by a second display element such as an organic light-emitting diode. Each of the second pixels Pa may emit, for example, red, green, blue, or white light. The second area DA2 is covered with a sealing member, and may be protected from an ambient air or moisture. A resolution of the second area DA2 may be about ½, ⅜, ⅓, ¼, 2/9, ⅛, 1/9, 1/16, etc. that of the first area DA1. For example, the resolution of the first area DA1 may be about 400 ppi or more, and the resolution of the second area DA2 may be about 200 ppi or about 100 ppi.

The second pixel circuit PCa for driving the second pixel Pa may be arranged in the pixel circuit unit PCP arranged in the peripheral area DPA. The pixel circuit unit PCP may be arranged in the pixel circuit unit PCP and close to the second area DA2. For example, when the second area DA2 is arranged at a top side of the display area DA, the pixel circuit unit PCP may be arranged at a top side of the peripheral area DPA. The second pixel circuit PCa may be connected to a second display element that implements the second pixel Pa, by the connection line TWL extending in a y direction.

In addition to the pixel circuit unit PCP, a first scan driving circuit SDRV1, a second scan driving circuit SDRV2, a terminal unit PAD, a first driving voltage supply line **11*a***, and a common voltage supply line (not shown) may be arranged in the peripheral area DPA. Each of the first pixel circuit PCm and the second pixel circuit PCa may be electrically connected to outer circuits arranged in the peripheral area DPA.

The first scan driving circuit SDRV1 may apply a scan signal to each of the first pixel circuits PCm for driving the first pixels Pm, via a main scan line SL. The first scan driving circuit SDRV1 may apply an emission control signal to each of the pixel circuits via a main emission control line EL. The second scan driving circuit SDRV2 may be on the opposite side of the first scan driving circuit SDRV1 with respect to the first area DA1, and may be in approximately parallel with the first scan driving circuit SDRV1. Some of pixel circuits of the first pixels Pm of the first area DA1 may be electrically connected to the first scan driving circuit SDRV1, and the remaining pixel circuits may be electrically connected to the second scan driving circuit SDRV2.

The terminal unit PAD may be arranged at one side of the substrate 100. The terminal unit PAD is exposed without being covered with an insulating layer, and is connected to a display circuit board 30. A display driving unit 32 may be arranged in the display circuit board 30.

The display driving unit 32 may generate a control signal to be transmitted to the first scan driving circuit SDRV1 and the second scan driving circuit SDRV2. The display driving unit 32 generates a data signal, and the generated data signal may be transmitted to the first pixel circuits PCm via a fan-out line FW and a main data line DL connected to the fan-out line FW.

The display driving unit 32 may apply a driving voltage to the first driving voltage supply line 11*a*, and may apply a common voltage to a common voltage supply line. The driving voltage may be applied to pixel circuits of the first and second pixels Pm and Pa via a driving voltage line PL connected to the first driving voltage supply line 11*a*, and the common voltage line may be connected to the common voltage supply line (not shown) and applied to an opposite electrode of the display element.

The first driving voltage supply line 11*a* may extend in the x direction at a lower side of the first area DA1. Although not shown in FIG. 3, a second driving voltage supply line (not shown) may be arranged at an upper side of the display area DA. The second driving voltage supply line described above may extend in the x direction at an upper side of the pixel circuit unit PCP. The common voltage supply line (not shown) has a loop shape with one side opened, and may partially surround the display area DA.

In FIG. 3, only one second area DA2 is shown. However, the second area DA2 may be provided in plurality. In this case, a plurality of second areas DA2 may be spaced apart from each other, and a first camera may be arranged to correspond to one second area DA2, and a second camera may be arranged to correspond to another second area DA2. In some embodiments, a camera may be arranged to correspond to one second area DA2, and an infrared sensor may be arranged to correspond to the other second area DA2. Shapes and sizes of the plurality of second areas DA2 may be different from each other.

The second area DA2 may have a circular shape, an oval shape, a polygonal shape, or an amorphous shape. In some embodiments, the second area DA2 may have an octagonal shape. The second area DA2 may be a polygon of various shapes, such as a quadrilateral shape, a hexagonal shape, or the like. The second area DA2 may be surrounded by the first area DA1.

Figure 4:
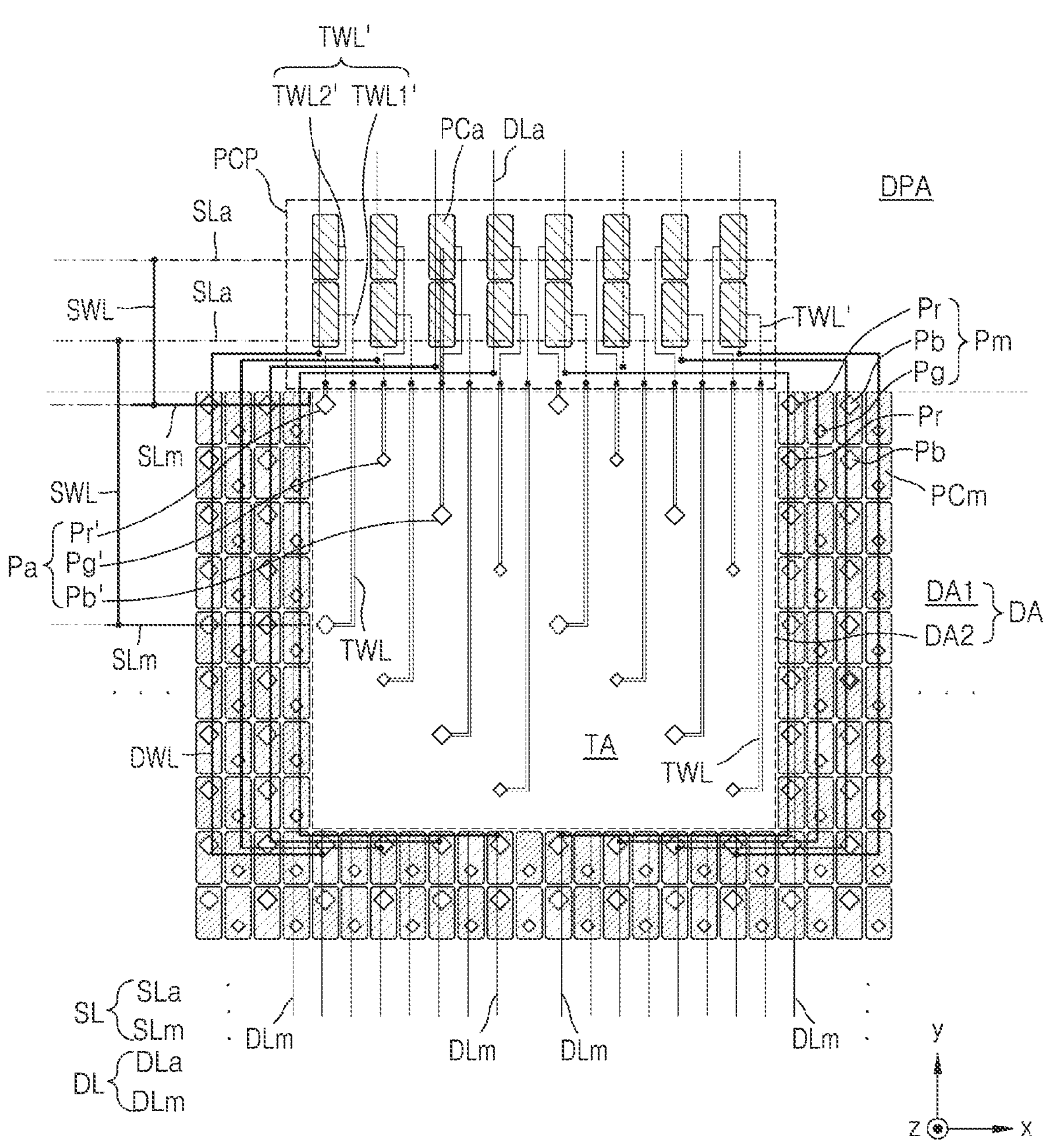
FIG. 4 is a plan layout view schematically illustrating a partial area of a display panel according to an embodiment.

FIG. 4 is a plan layout view schematically illustrating a partial area of a display panel according to an embodiment. As an example, FIG. 4 shows a second area DA2, a first area DA1 therearound, and a pixel circuit unit PCP arranged in a peripheral area DPA.

Referring to FIG. 4, a plurality of first pixels Pm may be arranged in the first area DA1. In the present disclosure, the first pixel Pm is a sub-pixel, which is the smallest unit for implementing an image, and refers to an emission area that emits light by a display element. Meanwhile, when an organic light-emitting diode is used as a display element, the emission area may be defined by an opening of a pixel-defining layer. This will be described later. Each of the plurality of first pixels Pm may emit one of red, green, blue, and white light.

In some embodiments, a first pixel Pm arranged in the first area DA1 may include a first sub-pixel Pr, a second sub-pixel Pg, and a third sub-pixel Pb. The first sub-pixel Pr, the second sub-pixel Pg, and the third sub-pixel Pb may implement red, green, and blue, respectively. The first pixels Pm may be arranged in a PenTile™ structure.

For example, the first sub-pixels Pr may be arranged at first and third vertices facing each other among vertices of a virtual rectangle having a center point of a second sub-pixel Pg as a center point of the rectangle, and third sub-pixels Pb may be arranged at the remaining vertices, that is, second and fourth vertices. An area of the second sub-pixel Pg may be less than an area of the first sub-pixel Pr and the third sub-pixel Pb.

This pixel arrangement structure is referred to as a PenTile™ matrix structure, or a PenTile™ structure, and may implement high resolution by using a small number of pixels by applying a rendering driving that shares adjacent pixels to express colors.

In FIG. 4, the plurality of first pixels Pm are arranged in a PenTile™ matrix structure, but the present disclosure is not limited thereto. For example, the plurality of first pixels Pm may be arranged in various shapes such as a stripe structure, a mosaic array structure, a delta array structure, or the like.

In the first area DA1, first pixel circuits PCm may overlap the first pixels Pm, and may be arranged in a matrix shape in the x direction and they direction. In the present disclosure, the first pixel circuit PCm refers to a unit of pixel circuit that implements one first pixel Pm.

A plurality of second pixels Pa may be arranged in the second area DA2. Each of the plurality of second pixels Pa is a sub-pixel, and may emit one of red, green, blue, and white light. The second pixels Pa may include a first sub-pixel Pr', a second sub-pixel Pg', and a third sub-pixel Pb' each emitting light of different colors from each other. The first sub-pixel Pr', the second sub-pixel Pg', and the third sub-pixel Pb' may implement red, green, and blue, respectively.

A number per unit area of the second pixels Pa arranged in the second area DA2 may be less than a number per unit area of the first pixels Pm arranged in the first area DA1. For example, a number of second pixels Pa and a number of first pixels Pm per same area may be provided in a ratio of 1:2, 1:4, 1:8, or 1:9. In other words, a resolution of the second area DA2 may be about ½, ¼, ⅛, or ⅑ that of the first area DA1. In FIG. 4, the resolution of the second area DA2 is about ⅛ that of the first area DA1.

The second pixels Pa arranged in the second area DA2 may arranged in various shapes. Some of the second pixels Pa may gather together and form a pixel group, and the second pixels Pa may be arranged in various shapes such as a PenTile™ structure, a stripe structure, a mosaic array structure, and a delta array structure within the pixel group. In this case, a distance between the second pixels Pa arranged within the pixel group may be equal to a distance between the first pixels Pm.

In some embodiments, as shown in FIG. 4, the second pixels Pa may be arranged in a distributed manner in the second area DA2. In other words, the distance between the second pixels Pa may be greater than the distance between the first pixels Pm. Meanwhile, an area of the second area DA2 in which the second pixels Pa are not arranged may be referred to as a transmissive area TA having a high light transmittance.

Second pixel circuits PCa implementing light emission of the second pixels Pa may be arranged in the peripheral area DPA. Because the second pixel circuits PCa are not arranged in the second area DA2, a larger transmissive area TA of the second area DA2 may be ensured. In addition, lines for applying a constant voltage or signals to the second pixel circuit PCa are not arranged in the second area DA2, and thus, the second pixels Pa may be freely arranged regardless of a line arrangement.

The second pixel circuits PCa may be connected to the second pixels Pa by connection lines. The connection line may include at least one transparent connection line TWL and at least one metal connection line TWL'.

The transparent connection line TWL is at least partially arranged in the second area DA2, and may include a transparent conductive material. For example, the transparent connection line TWL may include a transparent conducting oxide (TCO). The transparent connection line TWL may include a conducting oxide such as indium tin oxide (ITO), indium zinc oxide (IZO), zinc oxide (ZnO), indium oxide ($In_2O_3$), indium gallium oxide (IGO), or aluminum zinc oxide (AZO).

That the transparent connection line TWL is connected to the second pixel Pa may denote that the transparent connection line TWL is electrically connected to a pixel electrode of a second display element for implementing the second pixel Pa.

The transparent connection line TWL may be connected to the second pixel circuits PCa through the metal connection line TWL'. The metal connection line TWL' may be a line arranged in the peripheral area DPA, and one end of the metal connection line TWL' is connected to the second pixel circuit PCa, and the other end of the metal connection line TWL' is connected to the transparent connection line TWL.

The metal connection line TWL' may include a conductive material including molybdenum (Mo), aluminum (Al), copper (Cu), titanium (Ti), etc., and may include a single layer or multiple layers including the materials described above. The metal connection line TWL' may be provided in plurality between the second pixel circuits PCa.

In some embodiments, the metal connection line TWL' may include a first metal connection line TWL1' and a second metal connection line TWL2' arranged on different layers from each other. For example, the first metal connection line TWL1' may be arranged on the same layer as a data line DL, and may include the same material as the data line DL. The second metal connection line TWL2' and the first metal connection line TWL1' may be arranged with an insulating layer therebetween. For example, the second metal connection line TWL2' is arranged on the same layer as a pixel electrode 121 (see FIG. 5A) of an organic light-emitting diode OLED (see FIG. 5A), and may include the same material as a first pixel electrode 121 (see FIG. 5A). In some embodiments, the second metal connection line TWL2' may include the same material as a connection electrode CM (see FIG. 5A), and may be arranged on the same layer as the connection electrode CM.

The first metal connection line TWL1' and the second metal connection line TWL2' may be arranged between the second pixel circuits PCa, and may be at least partially bent in a plan view. In some embodiments, the first metal connection line TWL1' and the second metal connection line TWL2' arranged on different layers from each other may be provided in plurality, and the first metal connection line TWL1' and the second metal connection line TWL2' may be alternately arranged in areas between the plurality of second pixel circuits PCa.

The transparent connection line TWL is arranged in the second area DA2, and may be connected to the metal connection line TWL' at an edge of the second area DA2. The transparent connection line TWL may include a transparent conductive material.

The metal connection line TWL' may be arranged on the same layer as the transparent connection line TWL, or may be arranged on a different layer from the transparent connection line TWL. When the metal connection line TWL' and the transparent connection line TWL are arranged on different layers from each other, the metal connection line TWL' and the transparent connection line TWL may be connected to each other through a contact hole.

The metal connection line TWL' may have a higher conductivity than the transparent connection line TWL. Because the metal connection line TWL' is arranged in the peripheral area DPA, it is not necessary to ensure a light transmittance, and thus, the metal connection line TWL' may include a material having a lower light transmittance and a higher conductivity than the transparent connection line TWL. Thus, a resistance of the transparent connection line TWL may be minimized.

A scan line SL may include a main scan line SLm connected to the first pixel circuits PCm and an auxiliary scan line SLa connected to the second pixel circuits PCa. The main scan line SLm extends in the x direction, and may be connected to the first pixel circuits PCm. The main scan line SLm may not be arranged in the second area DA2. In other words, the main scan line SLm may be disconnected with the second area DA2 therebetween. In this case, a main scan line SLm arranged on a left side of the second area DA2 may receive a signal from the first scan driving circuit SDRV1 (see FIG. 3), and a main scan line SLm arranged on a right side of the second area DA2 may receive a signal from the seconds can driving circuit SDRV2 (see FIG. 3).

The auxiliary scan line SLa may be connected to the second pixel circuits PCa for driving the second pixel Pa arranged in the same row among the second pixel circuits PCa arranged in the same row.

The main scan line SLm and the auxiliary scan line SLa are connected to each other by a scan connection line SWL, and thus, the same signal may be transmitted to a pixel circuit for driving the first pixel Pm and a pixel circuit for driving the second pixel Pa that are arranged in the same row.

The scan connection line SWL is arranged on a different layer from the main scan line SLm and the auxiliary scan line SLa, and the scan connection line SWL may be connected to each of the main scan line SLm and the auxiliary scan line SLa through contact holes. The scan connection line SWL may be arranged in the peripheral area DPA.

The data line DL may include a main data line DLm connected to the first pixel circuits PCm, and an auxiliary data line DLa connected to the second pixel circuits PCa. The main data line DLm extends in the y direction, and may be connected to first pixel circuits PCm arranged in the same column. The auxiliary data line DLa extends in the y direction, and may be connected to second pixel circuits PCa arranged in the same column.

The main data line DLm and the auxiliary data line DLa may be spaced apart from each other with respect to the second area DA2 therebetween. The main data line DLm and the auxiliary data line DLa are connected to each other by a data connection line DWL, and thus, the same signal may be transmitted to a pixel circuit for driving the first pixel Pm and a pixel circuit for driving the second pixel Pa that are arranged in the same column.

The data connection line DWL may be arranged to bypass the second area DA2. The data connection line DWL may be arranged to overlap the first pixel circuits PCm arranged in the first area DA1. As the data connection line DWL is arranged in the first area DA1, it is not necessary to ensure an additional space in which the data connection line DWL is to be arranged, and thus, a dead space area may be minimized.

The data connection line DWL is arranged on a different layer from the main data line DLm and the auxiliary data line DLa, and the data connection line DWL may be connected to each of the main data line DLm and the auxiliary data line DLa through contact holes.

Figure 5A:
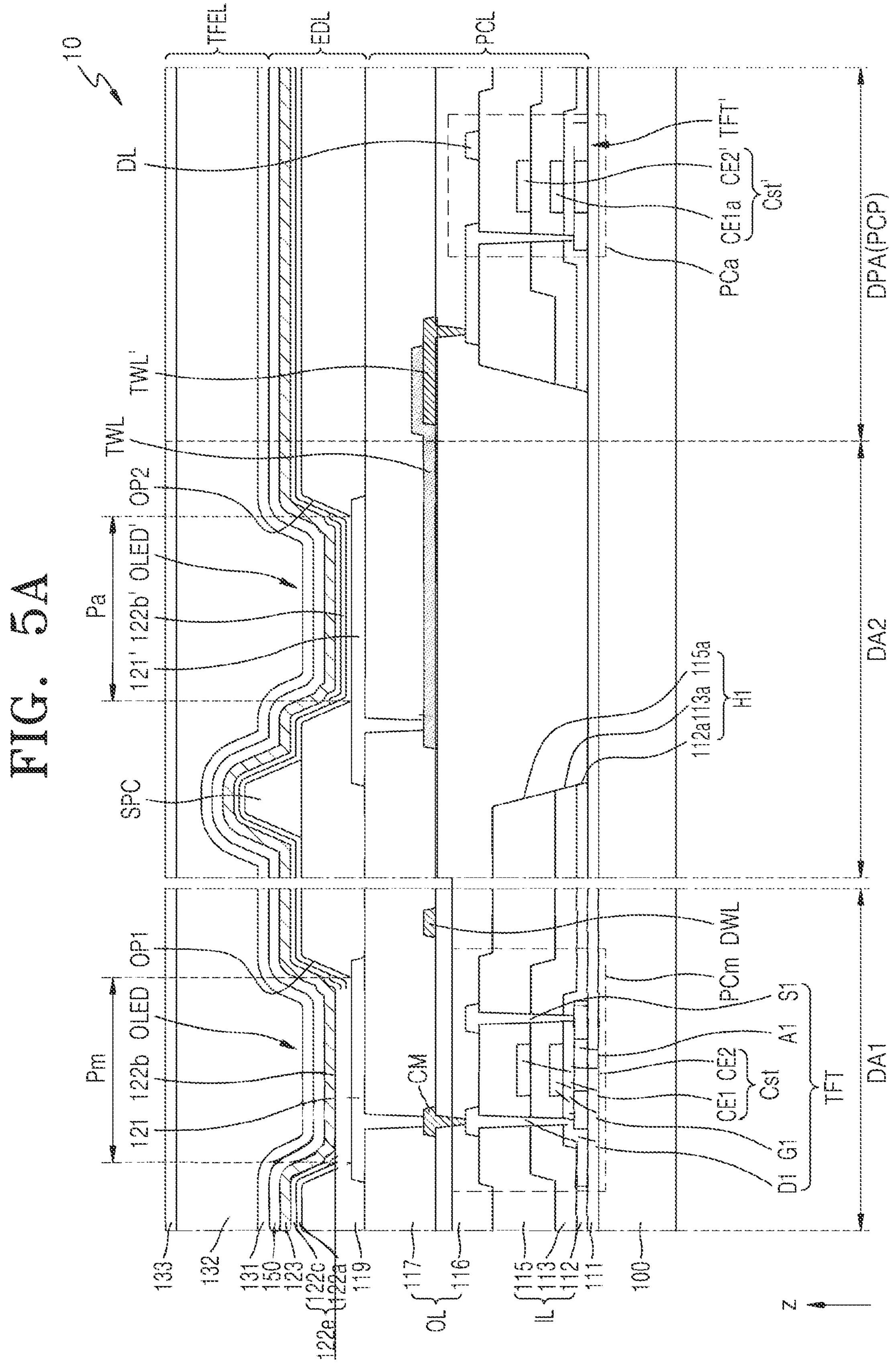
FIG. 5A is a cross-sectional view schematically illustrating a portion of a display panel according to an embodiment.

FIG. 5A is a cross-sectional view schematically illustrating a first area DA1, a second area DA2, and a portion of a peripheral area DPA of a display panel 10 according to an embodiment.

Referring to FIG. 5A, a first pixel Pm is arranged in the first area DA1, and a second pixel Pa is arranged in the second area DA2. A first pixel circuit PCm including a main thin-film transistor TFT and a main storage capacitor Cst, and a first organic light-emitting diode OLED as a first display element connected to the first pixel circuit PCm may be arranged in the first area DA1. A second organic light-emitting diode OLED' as a second display element may be arranged in the second area DA2. A second pixel circuit PCa including an auxiliary thin-film transistor TFT' and an auxiliary storage capacitor Cst' may be arranged in the peripheral area DPA. A transparent connection line TWL connecting the second pixel circuit PCa and the second organic light-emitting diode OLED' to each other may be arranged in the second area DA2.

In the present disclosure, it is described as an example that an organic light-emitting diode is used as a display element, but in another embodiment, an inorganic light-emitting device or a quantum dot light-emitting device may be used as a display element.

A stacked structure of elements included in the display panel 10 will be described below. In the display panel 10, a substrate 100, a buffer layer 111, a circuit layer PCL, and a display element layer EDL may be stacked.

The substrate 100 may include an insulating material such as glass, quartz, and a polymer resin. The substrate 100 may include a rigid substrate, or a flexible substrate that is bendable, foldable, or rollable.

The buffer layer 111 may be arranged on the substrate 100 to reduce or block penetration of foreign substances, moisture, or ambient air from below the substrate 100 and provide a flat surface arranged on the substrate 100. The buffer layer 111 may include an inorganic material such as an oxide or a nitride, an organic material, or an organic and inorganic compound, and may have a single-layer or multi-layer structure of an inorganic material and an organic material. A barrier layer (not shown) for blocking penetration of ambient air may be further included between the substrate 100 and the buffer layer 111. In some embodiments, the buffer layer 111 may include a silicon oxide ($SiO_2$) or a silicon nitride ($SiN_X$).

The circuit layer PCL is arranged on the buffer layer 111, and may include the first and second pixel circuits PCm and PCa, a first gate insulating layer 112, a second gate insulating layer 113, an interlayer insulating layer 115, a first organic insulating layer 116, and a second organic insulating layer 117. The first pixel circuit PCm may include the main thin-film transistor TFT and the main storage capacitor Cst, and the second pixel circuit PCa may include the auxiliary thin-film transistor TFT' and the auxiliary storage capacitor Cst'.

The main thin-film transistor TFT and the auxiliary thin-film transistor TFT' may be arranged above the buffer layer 111. The main thin-film transistor TFT may include a first semiconductor layer A1, a first gate electrode G1, a first source electrode S1, and a first drain electrode D1. The main thin-film transistor TFT may be connected to the first organic light-emitting diode OLED to drive the first organic light-emitting diode OLED. The auxiliary thin-film transistor TFT' may be connected to the second organic light-emitting diode OLED' to drive the second organic light-emitting diode OLED'. The auxiliary thin-film transistor TFT' has a similar configuration to the main thin-film transistor TFT, and thus, redundant descriptions thereof will be omitted.

The first semiconductor layer A1 is arranged on the buffer layer 111, and may include polysilicon. In another embodiment, the first semiconductor layer A1 may include amorphous silicon. In another embodiment, the first semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel area, a source area, and a drain area, the source area and the drain area being doped with impurities.

The first gate insulating layer 112 may cover the first semiconductor layer A1. The first gate insulating layer 112 may include an inorganic insulating material such as $SiO_2$, $SiN_X$, $SiO_XN_y$, $Al_2O_3$, $TiO_2$, $Ta_2O_5$, $HfO_2$, or ZnO. The first gate insulating layer 112 may include a single layer or multiple layers including the inorganic insulating materials described above.

The first gate electrode G1 is arranged above the first gate insulating layer 112 so as to overlap the first semiconductor layer A1. The first gate electrode G1 includes Mo, Al, Cu, Ti, etc., and may include a single layer or multiple layers. For example, the first gate electrode G1 may include a single Mo layer.

The second gate insulating layer 113 may cover the first gate electrode G1. The second gate insulating layer 113 may include an inorganic insulating material such as $SiO_2$, $SiN_X$, $SiO_XN_y$, $Al_2O_3$, $TiO_2$, $Ta_2O_5$, $HfO_2$, or ZnO. The second gate insulating layer 113 may include a single layer or multiple layers including the inorganic insulating materials described above.

An upper electrode CE2 of the main storage capacitor Cst and an upper electrode CE2' of the auxiliary storage capacitor Cst' may be arranged above the second gate insulating layer 113.

In the first area DA1, the upper electrode CE2 of the main storage capacitor Cst may overlap the first gate electrode G1 therebelow. The first gate electrode G1 and the upper electrode CE2 overlapping each other with respect to the second gate insulating layer 113 therebetween may constitute the main storage capacitor Cst. The first gate electrode G1 may include a lower electrode CE1 of the main storage capacitor Cst.

In the peripheral area DPA, the upper electrode CE2' of the auxiliary storage capacitor Cst' may overlap a gate electrode of the auxiliary thin-film transistor TFT' therebelow. The gate electrode of the auxiliary thin-film transistor TFT' may include a lower electrode CE1' of the auxiliary storage capacitor Cst'.

The upper electrodes CE2 and CE2' may include Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu, and may include a single layer or multiple layers of the materials described above.

The interlayer insulating layer 115 may cover the upper electrodes CE2 and CE2'. The interlayer insulating layer 115 may include $SiO_2$, $SiN_X$, $SiO_XN_Y$, $Al_2O_3$, $TiO_2$, $Ta_2O_5$, $HfO_2$, ZnO, or the like. The interlayer insulating layer 115 may include a single layer or multiple layers including the inorganic insulating materials described above.

The first source electrode S1 and the first drain electrode D1 may be arranged on the interlayer insulating layer 115. Each of the first source electrode S1 and the first drain electrode D1 may include a conductive material including Mo, Al, Cu, Ti, etc., and may have multiple layers or a single layer including the materials described above. For example, each of the first source electrode S1 and the first drain electrode D1 may have a multi-layer structure of a Ti layer, an Al layer, and another Ti layer.

An opening H1 corresponding to the second area DA2 may be defined in inorganic insulating layer IL of the display panel 10. For example, when the first gate insulating layer 112, the second gate insulating layer 113, and the interlayer insulating layer 115 are collectively referred to as the inorganic insulating layer IL, the opening H1 corresponding to the second area DA2 may be defined in the inorganic insulating layer IL. The opening H1 may expose a portion of an upper surface of the buffer layer 111 or the substrate 100. The opening H1 may be provided by overlapping a first opening 112*a* of the first gate insulating layer 112, a second opening 113*a* of the second gate insulating layer 113, and a third opening 115*a* of the interlayer insulating layer 115 that are provided to correspond to the second area DA2. The first to third openings 112*a*, 113*a*, and 115*a* may be individually provided through separate processes, or may be simultaneously provided through the same process. The first organic insulating layer 116 may be filled in the opening H1 of the inorganic insulating layer IL.

The first organic insulating layer 116 covers the first source electrodes S1 and the first drain electrodes D1 of the first area DA1 and the peripheral area DPA, and may fill the opening H1 of the inorganic insulating layer IL in the second area DA2.

The first organic insulating layer 116 may include general-purpose polymers such as photosensitive PI, PI, polystyrene (PS), polycarbonate (PC), benzocyclobutene (BCB), hexamethyldisiloxane (HMDSO), polymethyl methacrylate (PMMA), or polystyrene (PS), polymer derivatives having a phenol-based group, acryl-based polymers, imide-based polymers, aryl ether-based polymers, amide-based polymers, fluorine-based polymers, p-xylene-based polymers, or vinyl alcohol-based polymers.

In some embodiments, the first organic insulating layer 116 may include a siloxane-based organic material. The siloxane-based organic material may include HMDSO, octamethyltrisiloxane, decamethyltetrasiloxane, dodecamethylpentasiloxane, and polydimethylsiloxane.

A refractive index n1 of the first organic insulating layer 116 may be about 1.4 to about 1.6 with respect to a wavelength of about 550 nm. A connection electrode CM and various lines such as a data line DL may be arranged above the first organic insulating layer 116, and thus, it may be advantageous for high integration.

Meanwhile, the transparent connection line TWL may be provided above the first organic insulating layer 116 in the second area DA2. The transparent connection line TWL extends from the peripheral area DPA to the second area DA2, and may connect the second organic light-emitting diode OLED' and the second pixel circuit PCa to each other.

The transparent connection line TWL may be connected to the metal connection line TWL'. The metal connection line TWL' is arranged in the peripheral area DPA, and may be connected to the second pixel circuit PCa, for example, the auxiliary thin-film transistor TFT'. The transparent connection line TWL may be arranged in a transmissive area TA of the second area DA2. An end of the transparent connection line TWL may cover an end of the metal connection line TWL'.

The metal connection line TWL' may include a conductive material including Mo, Al, Cu, Ti, or the like, and may include a single layer or multiple layers including the above materials. In some embodiments, the metal connection line TWL' may have the same material as the connection electrode CM on the same layer as the connection electrode CM. In some embodiments, the metal connection line TWL' may have the same material as the data line DL on the same layer as the data line DL. However, the present disclosure is not limited thereto. The metal connection line TWL' may be arranged on various layers. For example, the metal connection line TWL' may be arranged on the same layer as a first pixel electrode 121.

The transparent connection line TWL may include a transparent conductive material. For example, the transparent connection line TWL may include a TCO. The transparent connection line TWL may include a conducting oxide such as ITO, IZO, ZnO, $In_2O_3$, IGO, or AZO.

The metal connection line TWL' may have a higher conductivity than the transparent connection line TWL. Because the metal connection line TWL' is arranged in the peripheral area DPA, it is not necessary to ensure a light transmittance, and thus, the metal connection line TWL' may include a material having a lower light transmittance and a higher conductivity than the transparent connection line TWL.

The second organic insulating layer 117 may cover the transparent connection line TWL on the first organic insulating layer 116. The second organic insulating layer 117 may have a flat upper surface so that the first pixel electrode 121 and a second pixel electrode 121' arranged thereon may be provided flat. The second organic insulating layer 117 may have a siloxane-based organic material having high light transmittance and flatness. The siloxane-based organic material may include HMDSO, octamethyltrisiloxane, decamethyltetrasiloxane, dodecamethylpentasiloxane, and polydimethylsiloxane.

The second organic insulating layer 117 may include general-purpose polymers such as photosensitive PI, PI, BCB, HMDSO, PMMA, or PS, polymer derivatives having a phenol-based group, acryl-based polymers, imide-based polymers, aryl ether-based polymers, amide-based polymers, fluorine-based polymers, p-xylene-based polymers, or vinyl alcohol-based polymers.

The first and second organic light-emitting diode OLED and OLED' may be arranged on the second organic insulating layer 117. The first and second pixel electrodes 121 and 121' of the first and second organic light-emitting diodes OLED and OLED' may be connected to the first and second pixel circuits PCm and PCa, respectively, through the connection electrode CM arranged on the first organic insulating layer 116.

Each of the first pixel electrode 121 and the second pixel electrode 121' may include a conducting oxide such as ITO, IZO, ZnO, $In_2O_3$, IGO, or AZO. Each of the first pixel electrode 121 and the second pixel electrode 121' may include a reflective layer including Ag, Mg, Al, Pt, Pd, Au, Ni, Nd, Ir, Cr, or any compounds thereof. For example, the first pixel electrode 121 and the second pixel electrode 121' may each have a structure that provides layers including ITO, IZO, ZnO, or $In_2O_3$ above/below the above-described reflective layer. In this case, each of the first pixel electrode 121 and the second pixel electrode 121' may have a stacked structure of an ITO layer, an Ag layer, and another ITO layer.

A pixel-defining layer 119 covers an edge of each of the first pixel electrode 121 and the second pixel electrode 121' which are disposed on the second organic insulating layer 117. A first opening OP1 and a second opening OP2 exposing central portions of the first pixel electrode 121 and the second pixel electrode 121', respectively are defined in the pixel-defining layer 119. Sizes and shapes of emission areas of the first and second organic light-emitting diodes OLED and OLED', that is, the first and second sub-pixels Pm and Pa, are defined by the first opening OP1 and the second opening OP2, respectively.

The pixel-defining layer 119 may increase a distance between edges of the first and second pixel electrodes 121 and 121' and an opposite electrode 123 above the first and second pixel electrodes 121 and 121' to thereby prevent arcs, etc. from occurring at the edges of the first and second pixel electrodes 121 and 121'. The pixel-defining layer 119 may include an organic insulating material such as PI, polyamide, acrylic resins, BCB, HMDSO, and phenolic resins, and may be provided by spin coating, etc.

A spacer SPC may be arranged above the pixel-defining layer 119 in the second display area DA. The spacer SPC may prevent stamping caused by a mask process. The spacer SPC may include an organic insulating material such as PI, polyamide, acrylic resins, BCB, HMDSO, phenolic resins, or the like. In some embodiments, the spacer SPC may include the same material as the pixel-defining layer 119, and may be simultaneously provided with the pixel-defining layer by using a half-tone mask.

A first emission layer 122*b* and a second emission layer 122*b*', which are provided to correspond to the first pixel electrode 121 and the second pixel electrode 121', respectively, may be arranged in the first opening OP1 and the second opening OP2 of the pixel-defining layer 119, respectively. The first emission layer 122*b* and the second emission layer 122*b*' may each include a polymer material or a low-molecular weight material, and may emit red, green, blue, or white light.

An organic functional layer 122*e* may be arranged above and/or below the first emission layer 122*b* and the second emission layer 122*b*'. The organic functional layer 122*e* may include a first functional layer 122*a* and/or a second functional layer 122*c*. The first functional layer 122*a* or the second functional layer 122*c* may be omitted.

The first functional layer 122*a* may be arranged below the first emission layer 122*b* and the second emission layer 122*b*'. The first functional layer 122*a* may include a single layer or multiple layers of organic materials. The first functional layer 122*a* may include a hole transport layer (HTL) having a single-layer structure. In some embodiments, the first functional layer 122*a* may include a hole injection layer (HIL) and an HTL. The first functional layer 122*a* may be integrally provided as a single body to correspond to the first and second organic light-emitting diodes OLED and OLED' that are included in the first area DA1 and the second area DA2, respectively.

The second functional layer 122*c* may be arranged above the first emission layer 122*b* and the second emission layer 122*b*'. The second functional layer 122*c* may include a single layer or multiple layers of organic materials. The second functional layer 122*c* may include an electron transport layer (ETL) or an electron injection layer (EIL). The second functional layer 122*c* may be integrally provided as a single body to correspond to the first and second organic light-emitting diodes OLED and OLED' that are included in the first area DA1 and the second area DA2, respectively.

The opposite electrode 123 is arranged above the second functional layer 122*c*. The opposite electrode 123 may include a conductive material having a low work function. For example, the opposite electrode 123 may include a (semi-)transparent layer including Ag, Mg, Al, Pt, Pd, Au, Ni, Nd, Ir, Cr, lithium (Li), Ca, or any alloys thereof. In some embodiments, the opposite electrode 123 may further include a layer including ITO, IZO, ZnO, or $In_2O_3$, above the (semi-)transparent layer including the materials described above. The opposite electrode 123 may be integrally provided as a single body to correspond to the first and second organic light-emitting diodes OLED and OLED' that are included in the first area DA1 and the second area DA2, respectively.

Layers from the first pixel electrode 121 to the opposite electrode 123, which are provided in the first area DA1, may constitute the first organic light-emitting diode OLED. Layers from the second pixel electrode 121' to the opposite electrode 123, which are provided in the second area DA2, may constitute the second organic light-emitting diode OLED'.

An upper layer 150 including an organic material may be provided on the opposite electrode 123. The upper layer 150 may protect the opposite electrode 123 and improve light extraction efficiency. The upper layer 150 may include an organic material having a higher refractive index than the opposite electrode 123. In some embodiments, the upper layer 150 may include a stack of layers having different refractive indices. For example, the upper layer 150 may be provided by stacking a high-refractive index layer/low-refractive index layer/high-refractive index layer. A refractive index of the high-refractive index layer may be about 1.7 or greater, and a refractive index of the low-refractive index layer may be about 1.3 or less.

The upper layer 150 may further include lithium fluoride (LiF). In some embodiments, the upper layer 150 may further include an inorganic insulating material such as $SiO_2$ and $SiN_X$.

A thin-film encapsulation layer TFEL is arranged on the upper layer 150, and the first and second organic light-emitting diodes OLED and OLED' may be sealed by the thin-film encapsulation layer TFEL. The thin-film encapsulation layer TFEL may prevent external moisture or foreign substances from penetrating into the first and second organic light-emitting diodes OLED and OLED'.

The thin-film encapsulation layer TFEL may include at least one inorganic encapsulation layer and at least one organic encapsulation layer. In this regard, FIG. 5A shows that the thin-film encapsulation layer TFEL has a stacked structure of a first inorganic encapsulation layer 131, an organic encapsulation layer 132, and a second inorganic encapsulation layer 133. In another embodiment, a number of organic encapsulation layers, a number of inorganic encapsulation layers, and a stacked order may be changed.

Each of the first inorganic encapsulation layer 131 and the second inorganic encapsulation layer 133 may include one or more inorganic insulating materials such as $SiO_2$, $SiN_X$, $SiO_XN_y$, $Al_2O_3$, $TiO_2$, $Ta_2O_5$, $HfO_2$, or ZnO, and may be provided by CVD. The organic encapsulation layer 132 may include a polymer-based material. The polymer-based material may include silicon-based resins, acryl-based resins, epoxy-based resins, PI, and polyethylene. Each of the first inorganic encapsulation layer 131, the organic encapsulation layer 132, and the second inorganic encapsulation layer 133 may be integrally provided as a single body so as to cover the first area DA1 and the second area DA2.

In FIG. 5A, the opening H1 corresponding to the second area DA2 is formed in the inorganic insulating layer IL, but the present disclosure is not limited thereto. An opening corresponding to the second area DA2 may not be formed in the inorganic insulating layer IL, and may be continuously arranged in the second area DA2, as shown in FIG. 5B. Even when the inorganic insulating layer IL does not have an opening, a light transmittance of the second area DA2 may be ensured through a correlation between refractive indices of the inorganic insulating layer IL and an organic insulating layer OL.

Figure 6:
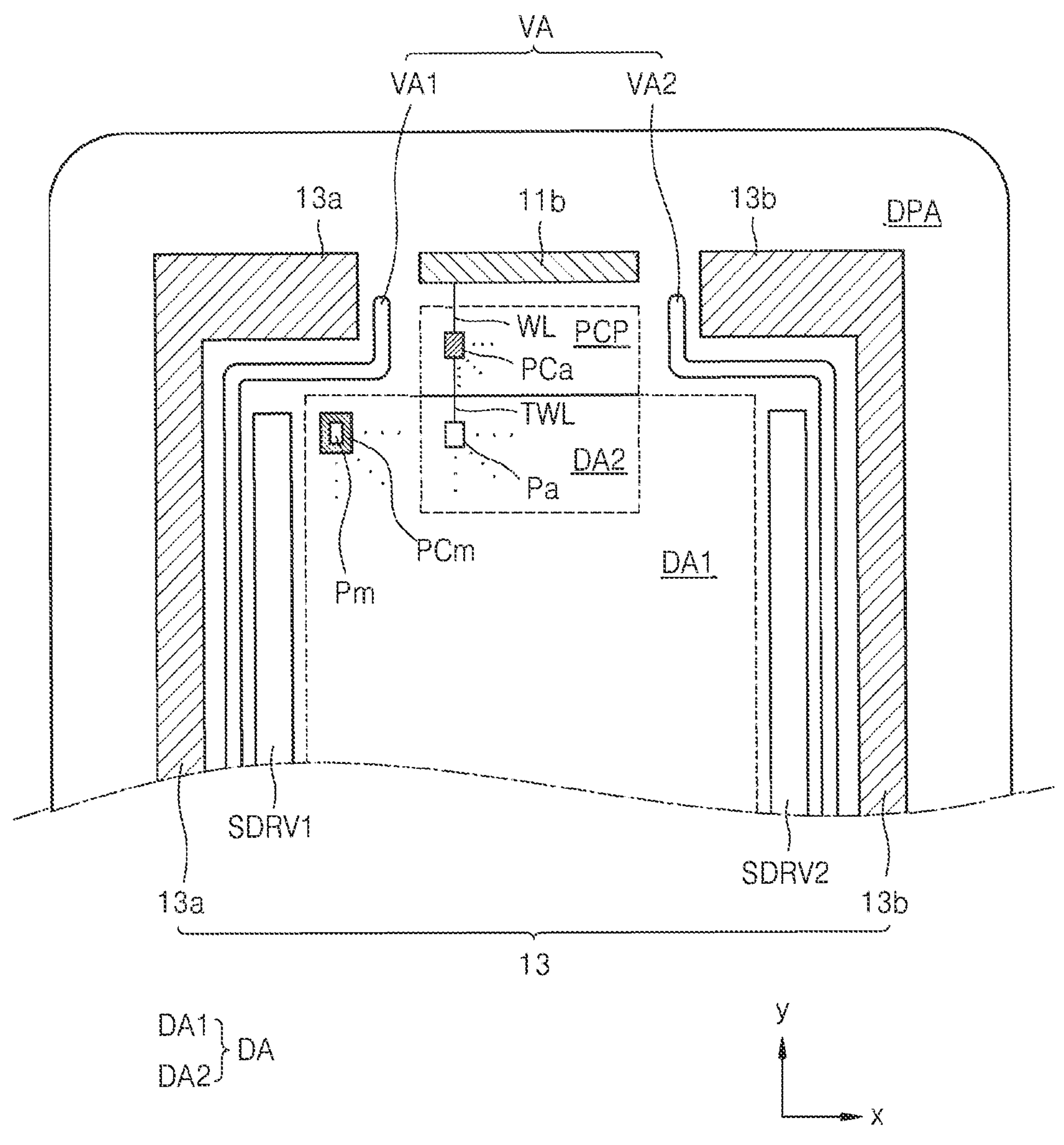
FIG. 6 is a plan view schematically illustrating a portion of a display panel according to an embodiment.

FIG. 6 is a plan view schematically illustrating a portion of a display panel according to an embodiment. For example, FIG. 6 shows a peripheral area DPA in which a pixel circuit unit PCP is arranged.

Referring to FIG. 6, a substrate 100 includes a display area DA for implementing an image, and the peripheral area DPA around the display area DA. A first pixel Pm and a first pixel circuit PCm, which are implemented as a first display element, are arranged in the first area DA1 of the display area DA, and a second pixel Pa implemented as a second display element is arranged in the second area DA2 of the display area DA.

The pixel circuit unit PCP may be arranged in an area adjacent to the second area DA2 in the peripheral area DPA. A second pixel circuit PCa connected to the second display element arranged in the second area DA2 may be arranged in the pixel circuit unit PCP. The second display element may be connected to the second pixel circuit PCa through a connection line TWL.

A valley portion VA surrounding at least a portion of the display area DA may be arranged in the peripheral area DPA. The valley portion VA may include an area provided by removing a portion of the organic insulating layer OL to prevent moisture permeating through the organic insulating layer OL (see FIG. 8) from being transferred to the display area DA. In other words, the valley portion VA may include an opening of the organic insulating layer OL between the first pixel circuit PCm and the first display element on the substrate 100.

In the present embodiment, the valley portion VA may include a first valley VA1 and a second valley VA2 that are spaced apart from each other with respect to the pixel circuit unit PCP therebetween. In other words, the pixel circuit unit PCP may be arranged between the first valley VA1 and the second valley VA2. The first valley VA1 and the second valley VA2 may be separate members that are spaced apart from each other even on a lower side of the display area DA. However, the present disclosure is not limited thereto. For example, the first valley VA1 and the second valley VA2 may be connected to each other on the lower side of the display area DA.

When the valley portion VA is continuously arranged within the pixel circuit unit PCP, a number of lines available in the pixel circuit unit PCP may decrease. For example, lines arranged above the organic insulating layer OL may become unavailable. When the valley portion VA is arranged above the pixel circuit unit PCP, a dead space may be extended.

In the present embodiment, the valley portion VA includes the first valley VA1 and the second valley VA2 which are apart from each other with the pixel circuit unit PCP therebetween, and by using lines arranged on various layers in the pixel circuit unit PCP, high integration may be implemented and a dead space may be reduced.

In addition, a common voltage supply line 13 arranged to at least partially surround the display area DA may be provided in the peripheral area DPA. The common voltage supply line 13 is a line for applying a common voltage ELVSS to the first display element and the second display element, arranged in the display area DA, and may be electrically connected to an opposite electrode 123 (see FIG. 5A) of the first display element and the second display element.

The common voltage supply line 13 may include a first common voltage supply line 13*a* and a second common voltage supply line 13*b* that are spaced apart from each other. The other ends of the first common voltage supply line 13*a* and the second common voltage supply line 13*b* may be connected to each other. In other words, the common voltage supply line 13 may include an open portion of a loop shape, the open portion including an upper side of the display area DA.

A second driving voltage supply line 11*b* may be arranged between the first common voltage supply line 13*a* and the second common voltage supply line 13*b*. The second driving voltage supply line 11*b* is electrically connected to the second pixel circuit PCa arranged in the pixel circuit unit PCP, and may apply a driving voltage ELVDD. The first common voltage supply line 13*a*, the second driving voltage supply line 11*b*, and the second common voltage supply line 13*b* may each extend in an x direction from the upper side of the display area DA.

The valley portion VA may be arranged between the common voltage supply line 13 and the display area DA in the peripheral area DPA. The first valley VA1 may be arranged between the first common voltage supply line 13*a* and the display area DA. The first valley VA1 may be arranged between the first common voltage supply line 13*a* and a first scan driving circuit SDRV1. The second valley VA2 may be arranged between the second common voltage supply line 13*b* and the display area DA. The second valley VA2 may be arranged between the second common voltage supply line 13*b* and a second scan driving circuit SDRV2. The valley portion VA may be bent along a peripheral shape of the display area DA and the pixel circuit unit PCP.

Figure 7:
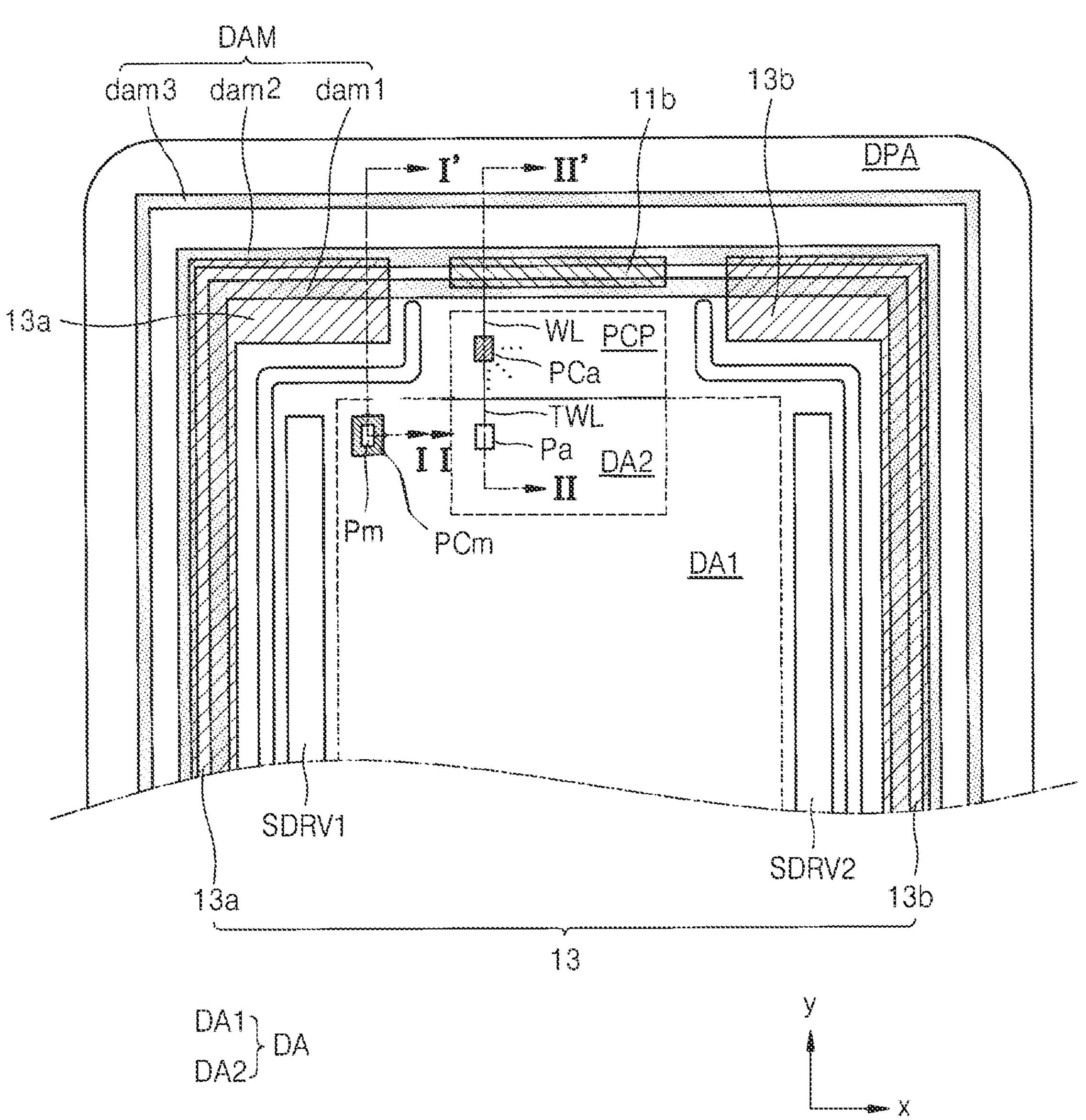
FIG. 7 is a plan view schematically illustrating a portion of a display panel according to an embodiment.

FIG. 7 is a plan view schematically illustrating a portion of a display panel according to an embodiment. In FIG. 7, the same reference symbols as those of FIG. 6 denote the same elements, and redundant descriptions thereof will be omitted.

Referring to FIG. 7, a dam portion DAM may be arranged in the peripheral area DPA of the substrate 100. The dam portion DAM may be arranged to at least partially surround the display area DA. The dam portion DAM is a structure that protrudes from an upper surface of the substrate 100, and may control a flow of an organic encapsulation layer of a thin-film encapsulation layer or block propagation of cracks when the substrate 100 is cut.

The dam portion DAM may have a plurality of dams spaced apart from one another. For example, the dam portion DAM may include a first dam dam1, a second dam dam2, and a third dam dam3 that are spaced apart from each other. The first dam dam1 may be arranged closer to the substrate 100 than the valley portion VA.

The first dam dam1 may be arranged to surround the valley portion VA. The first dam dam1 may be arranged to overlap the common voltage supply line 13. The first dam dam1 may cover one edge of the second driving voltage supply line 11*b*. The edge may include an edge adjacent to the pixel circuit unit PCP.

The second dam dam2 may be arranged to surround the first dam dam1. The second dam dam2 may be arranged closer to an edge of the substrate 100 than the first dam dam1. The second dam dam2 may be arranged to partially surround the common voltage supply line 13. The second dam dam2 may cover one edge of the common voltage supply line 13. The edge may include an edge adjacent to the edge of the substrate 100.

The third dam dam3 may be arranged to surround the second dam dam2. The third dam dam3 may be arranged closer to an edge of the substrate 100 than the second dam dam2. The third dam dam3 may prevent cracks from being propagated when the substrate 100 is cut.

Figure 8:
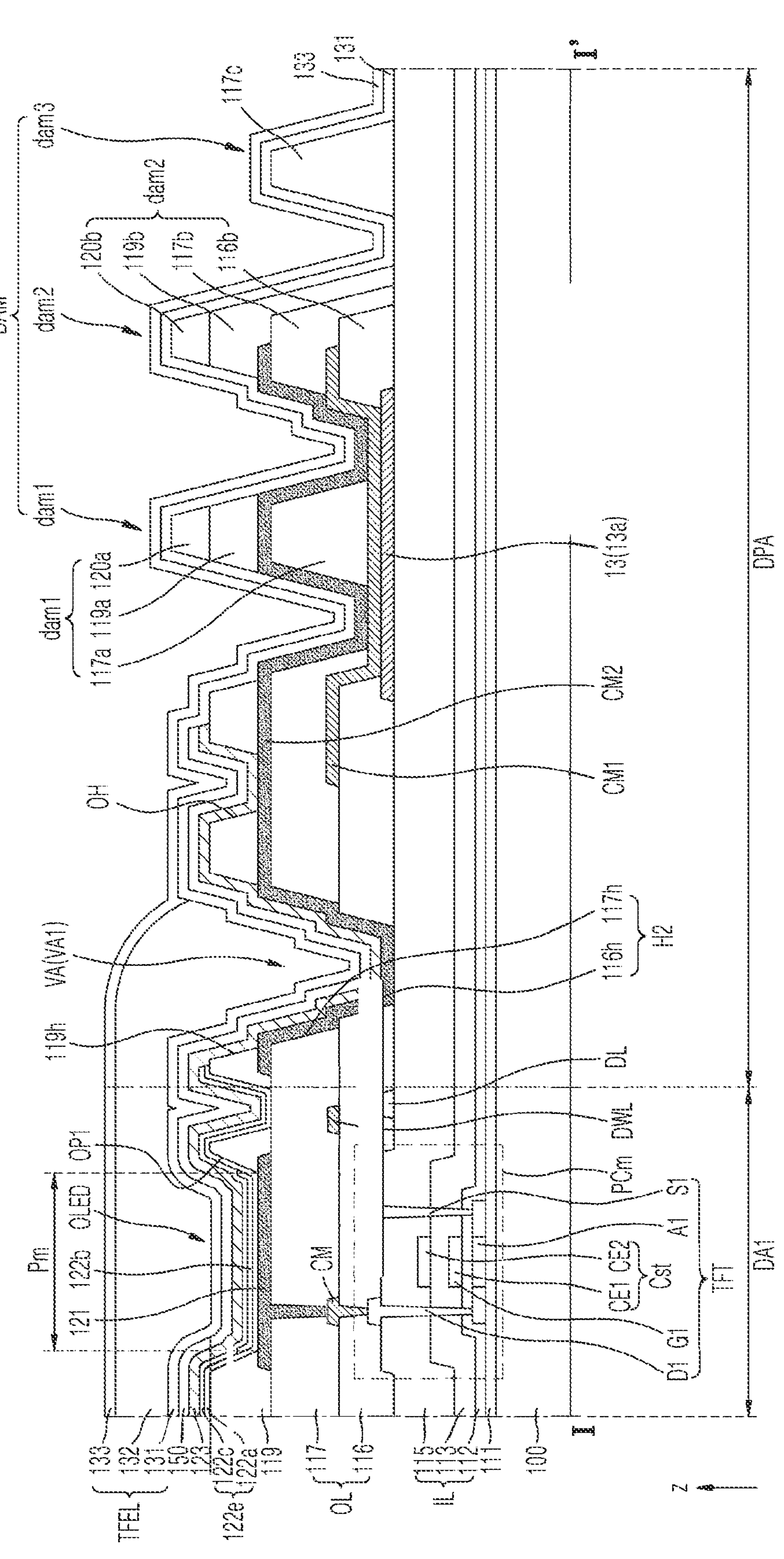
FIG. 8 is a cross-sectional view of the display panel in FIG. 7 taken along line I-I' in FIG. 7.
Figure 9:
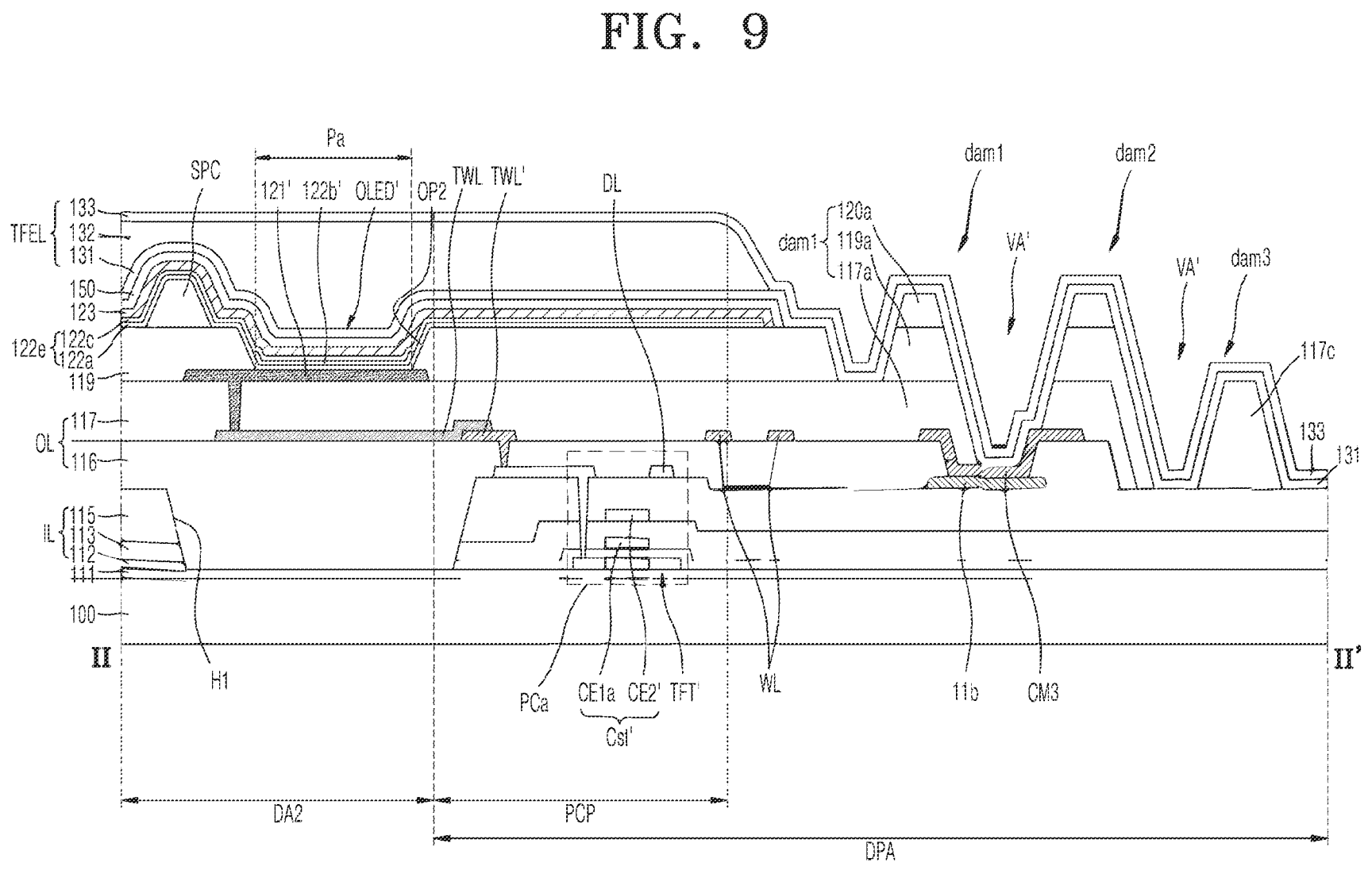

FIG. 8 is a cross-sectional view of the display panel in FIG. 7 taken along line I-I' in FIG. 7, and FIG. 9 is a cross-sectional view of the display panel in FIG. 7 taken along line II-II' in FIG. 7. In FIGS. 8 and 9, the same reference symbols as those of FIG. 5A denote the same elements, and redundant descriptions thereof will be omitted.

Referring to FIG. 8, the valley portion VA may be provided in the peripheral area DPA in a vicinity of the first area DA1. The valley portion VA may be arranged between the first area DA1 and the first dam dam1. The valley portion VA may include an opening H2 in the organic insulating layer OL. For example, when the first organic insulating layer 116 and the second organic insulating layer 117 are collectively referred to as an organic insulating layer OL, the organic insulating layer OL may have the organic insulating layer OL corresponding to the valley portion VA. The opening H2 may expose a portion of an upper surface of the inorganic insulating layer IL. The opening H2 may be provided by overlapping a fourth opening 116*h* of the first organic insulating layer 116 and a fifth opening 117*h* of the second organic insulating layer 117, which are provided to correspond to the valley portion VA. The fourth and fifth openings 116*h* and 117*h* may be individually provided through separate processes, or may be simultaneously provided through the same process.

The valley portion VA may include a sixth opening 119*h* in the pixel-defining layer 119. The pixel-defining layer 119 may have the sixth opening 119*h* corresponding to the valley portion VA. The sixth opening 119*h* may overlap the opening H2 of the organic insulating layer OL.

The fourth opening 116*h*, the fifth opening 117*h*, and the sixth opening 119*h* may have different diameters from one another. In some embodiments, a diameter of the sixth opening 119*h* may be greater than a diameter of the fifth opening 117*h*, and the diameter of the fifth opening 117*h* may be greater than a diameter of the fourth opening 116*h*.

Meanwhile, an opening OH, through which an upper surface of the organic insulating layer OL is exposed, may be provided in the pixel-defining layer 119 arranged outside of the valley portion VA. The opening OH may emit gas that may be generated in the opening OH during a process, to the outside.

As the valley portion VA is provided, moisture or ambient air that may permeate into the organic insulating layer OL from an edge of the substrate 100 may be blocked, and thus, the reliability of the first area DA1 may be ensured.

The thin-film encapsulation layer TFEL may be arranged above the valley portion VA. The organic encapsulation layer 132 of the thin-film encapsulation layer TFEL may be filled in the valley portion VA. The organic encapsulation layer 132 is arranged between the first inorganic encapsulation layer 131 and the second inorganic encapsulation layer 133, thus preventing moisture from permeating through the organic encapsulation layer 132.

The dam portion DAM may be arranged outside of the valley portion VA. The dam portion DAM may include the first dam dam1, the second dam dam2, and the third dam dam3 that are spaced apart from one another.

The first dam dam1 may overlap the common voltage supply line 13 arranged in the peripheral area DPA. The first dam dam1 may be provided by stacking a first layer 117*a* including the same material as the second organic insulating layer 117, a second layer 119*a* including the same material as the pixel-defining layer 119, and a third layer 120*a* including the same material as the spacer SPC (see FIG. 5A).

The common voltage supply line 13 is electrically connected to the opposite electrode 123, and may apply the common voltage ELVSS to the opposite electrode 123. The common voltage supply line 13 may be connected to the opposite electrode 123 through a first connection electrode CM1 and a second connection electrode CM2.

The first connection electrode CM1 may be arranged between the common voltage supply line 13 and the first layer 117*a* of the first dam dam1. The first connection electrode CM1 may extend to an upper surface of the first organic insulating layer 116.

The second connection electrode CM2 comes into contact with the first connection electrode CM1 above the common voltage supply line 13, and may extend to an upper surface of the second organic insulating layer 117 and into the valley portion VA. A portion of the second connection electrode CM2 may be arranged between the first layer 117*a* and the second layer 119*a* of the first dam dam1. The second connection electrode CM2 may include the same material as the first pixel electrode 121. The second connection electrode CM2 may come into contact with the opposite electrode 123 on the upper surface of the second organic insulating layer 117 and within the valley portion VA.

The second dam dam2 may be spaced apart from the first dam dam1 and arranged outside of the first dam dam1. The second dam dam2 may cover an edge of the common voltage supply line 13. The second dam dam2 may be provided by stacking a first layer 116*b* including the same material as the first organic insulating layer 116, a second layer 117*b* including the same material as the second organic insulating layer 117, a third layer 119*b* including the same material as the pixel-defining layer 119, and a fourth layer 120*b* including the same material as the spacer SPC (see FIG. 5A).

The third dam dam3 may be spaced apart from the second dam dam2 and arranged outside of the second dam dam2. The third dam dam3 may include a first layer 117*c* including the same material as the second organic insulating layer 117. The third dam dam3 is arranged adjacent to an edge of the substrate 100, and prevents cracks from being propagated when the substrate 100 is cut. A height of the third dam dam3 may be less than heights of each of the first dam dam1 and the second dam dam2.

Referring to FIG. 9, the peripheral area DPA in a vicinity of the second area DA2 may be arranged in the pixel circuit unit PCP rather than the valley portion. The second pixel circuit PCa is arranged in the second pixel circuit PCa, and may be connected to the second organic light-emitting diode OLED' arranged in the second area DA2.

The first layer 117*a* of the first dam dam1 in a vicinity of the second area DA2 may be connected to the second organic insulating layer 117. As each of the first organic insulating layer 116 and the second organic insulating layer 117 extends to the pixel circuit unit PCP and the peripheral area DPA outside thereof, a line WL arranged above the first organic insulating layer 116 may be used, and thus, it may be advantageous for high integration.

The first dam dam1 may cover one edge of the second driving voltage supply line 11*b*. A third connection electrode CM3 may be arranged between the second driving voltage supply line 11*b* and the first dam dam1. The third connection electrode CM3 may extend to the upper surface of the second organic insulating layer 117. The second driving voltage supply line 11*b* may be connected to the second pixel circuit PCa of the pixel circuit unit PCP to apply the driving voltage ELVDD to the second pixel circuit PCa.

The first dam dam1 and the second dam dam2 are spaced apart from each other, and the second dam dam2 and the third dam dam3 are spaced apart from each other. Thus, a pseudo-valley portion VA', which is similar to the valley portion VA (see FIG. 8), may be provided between the first dam dam1 and the second dam dam2 and between the second dam dam2 and the third dam dam3. Thus, even when the valley portion VA of FIG. 8 is not arranged in some areas, ambient air may be prevented from permeating through an edge of the substrate 100.

Figure 10:
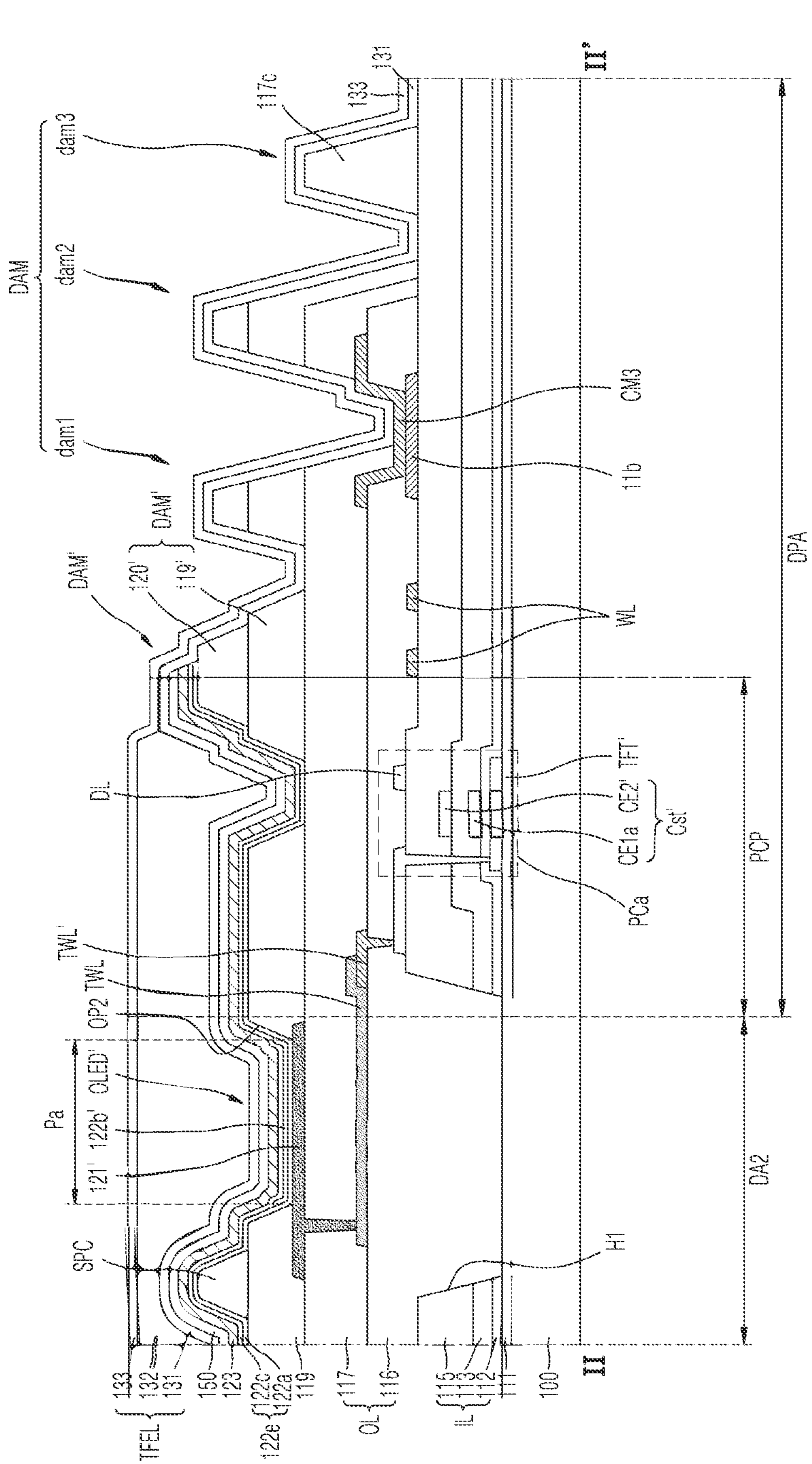
FIG. 10 is a cross-sectional view of the display panel in FIG. 7 taken along line II-II' in FIG. 7, according to an embodiment.

FIG. 10 is a cross-sectional view of the display panel in FIG. 7 taken along line II-II', according to an embodiment. In FIG. 10, the same symbols as those of FIG. 9 denote the same members, and redundant descriptions thereof will be omitted.

Referring to FIG. 10, an inner dam DAM', which at least partially overlaps the pixel circuit unit PCP, may further be arranged in the display panel according to an embodiment. The inner dam DAM' may at least partially overlap the second pixel circuit PCa. The inner dam DAM' may be arranged on the second organic insulating layer 117. The inner dam DAM' may be provided by stacking a first layer 119' including the same material as the pixel-defining layer 119, and a second layer 120' including the same material as the spacer SPC. The inner dam DAM' may control a flow of the organic encapsulation layer 132 of the thin-film encapsulation layer TFEL.

The dam portion DAM including a plurality of dams may be arranged outside of the inner dam DAM'. The dam portion DAM may include the first dam dam1, the second dam dam2, and the third dam dam3 that are spaced apart from one another. The organic insulating layer OL is disconnected between the first dam dam1 and the second dam 2 and between the second dam dam2 and the third dam dam3, and thus, ambient air that permeates through the edge of the substrate 100 may be blocked. Because the first organic insulating layer 116 extends to the pixel circuit unit PCP and a portion of the peripheral area DPA, a line WL arranged above the first organic insulating layer 116 may be used, and thus, it may be advantageous for high integration.

Figure 11:
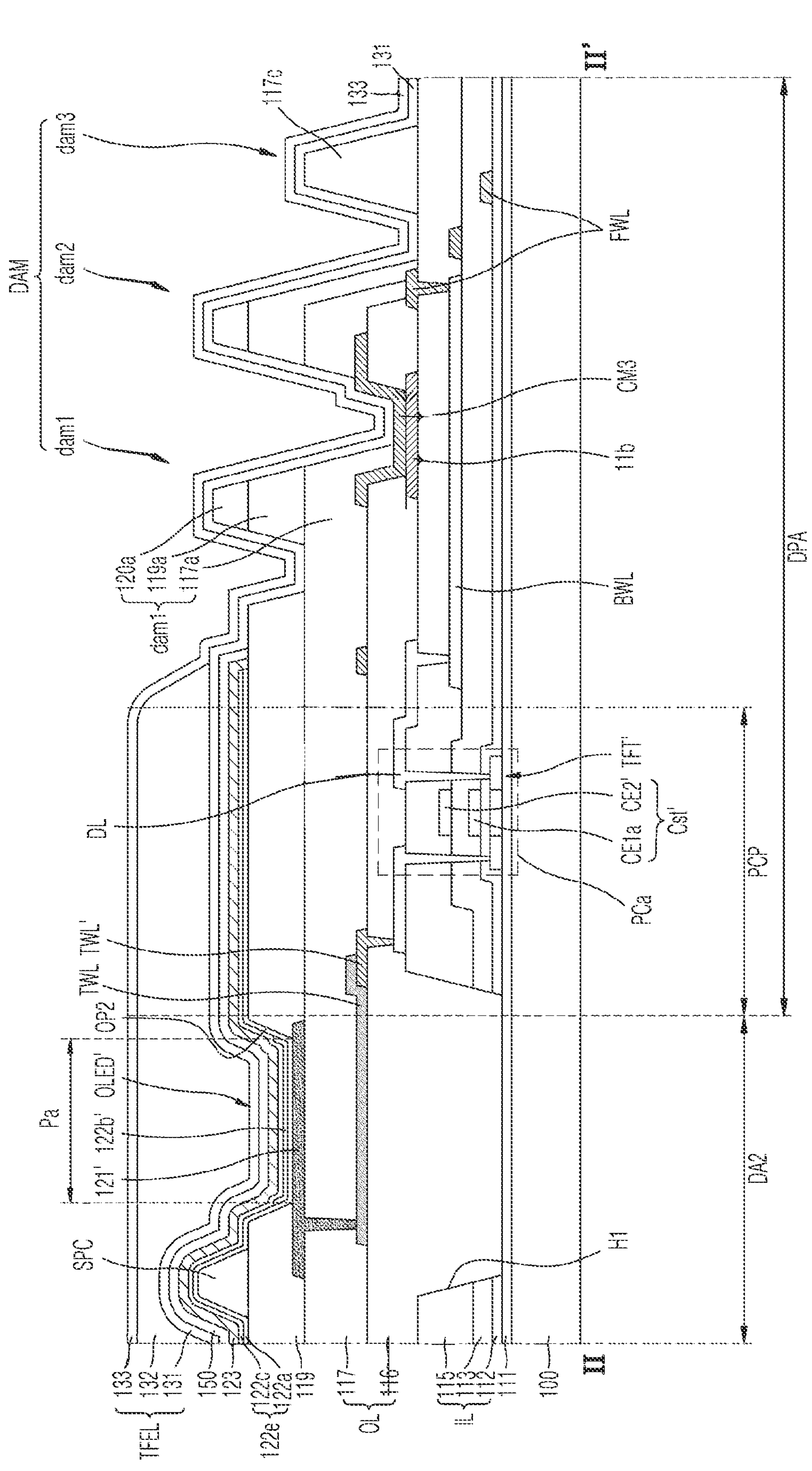
FIG. 11 is a cross-sectional view of the display panel in FIG. 7 taken along line II-II' in FIG. 7, according to an embodiment.

FIG. 11 is a cross-sectional view of the display panel in FIG. 7 taken along line II-II' in FIG. 7, according to an embodiment. In FIG. 11, the same reference symbols as those of FIG. 9 denote the same members, and redundant descriptions thereof will be omitted.

Referring to FIG. 11, a fan-out line FWL overlapping the dam portion DAM may be arranged. The fan-out line FWL is a line connected to the terminal unit PAD (see FIG. 3), and may transmit signals, for example, data signals, received from the display circuit board 30. The fan-out line FWL may be arranged above the first gate insulating layer 112, the second gate insulating layer 113, and/or the interlayer insulating layer 115.

The fan-out line FWL may be connected to the second pixel circuit PCa by a bridge line BWL. In this case, the bridge line BWL is arranged on a different layer from the fan-out line FWL, and may be connected to the fan-out line FWL through a contact hole. For example, the fan-out line FWL may be arranged above the interlayer insulating layer 115, and the bridge line BWL may be arranged above the second gate insulating layer 113.

The bridge line BWL is arranged on a different layer from the second driving voltage supply line 11*b*, and may at least partially overlap the second driving voltage supply line 11*b*.

As described above, in a display panel and a display apparatus according to the embodiments of the present disclosure, a pixel circuit is not arranged in a component area, and thus, a larger transmissive area may be ensured to improve transmittance.

In addition, in a display panel and a display apparatus according to the embodiments of the present disclosure, a valley portion surrounding a display area is provided, and the valley portion includes a first valley and a second valley that are apart from each other with a pixel circuit unit therebetween. Thus, the pixel circuit unit may use lines of various layers.

However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a display panel including a first area in which a first display element and a first pixel circuit are arranged, a second area in which a second display element is arranged, and a peripheral area in which a pixel circuit unit including a second pixel circuit connected to the second display element is arranged; and a component arranged below the display panel to correspond to the second area, wherein the display panel includes:

a substrate;

an organic insulating layer that is arranged between the first display element and the first pixel circuit, and extends to the peripheral area; and a valley portion that is provided as an opening formed in the organic insulating layer in the peripheral area, wherein the valley portion includes a first valley and a second valley that are spaced apart from each other on a side of the first area opposite a terminal unit, and wherein the first valley is disposed on one side of the pixel circuit unit and the second valley is disposed on the other side of the pixel circuit unit in a plan view.

2. The display apparatus of claim 1, further comprising a dam portion that is arranged in the peripheral area, and protrudes from an upper surface of the substrate, wherein the valley portion is arranged between the first area and the dam portion.

3. The display apparatus of claim 1, further comprising an inner dam at least partially overlapping the second pixel circuit, wherein the inner dam is arranged on the organic insulating layer.

4. The display apparatus of claim 1, further comprising:

a dam portion arranged outside of the valley portion;

a fan-out line overlapping the dam portion; and a bridge line that is arranged on a different layer from a layer on which the fan-out line is arranged, and connects the fan-out line to the second pixel circuit.

5. The display apparatus of claim 1, further comprising a transparent connection line that connects the second display element to the second pixel circuit, wherein the organic insulating layer is provided by stacking a first organic insulating layer and a second organic insulating layer, and the transparent connection line is arranged between the first organic insulating layer and the second organic insulating layer.

6. The display apparatus of claim 1, further comprising an inorganic insulating layer disposed between the substrate and the organic insulating layer, wherein an opening corresponding to the second area is defined in the inorganic insulating layer, the opening being filled with the organic insulating layer.

7. The display apparatus of claim 1, wherein the component includes an imaging device.

8. A display panel comprising:

a substrate including a display area in which an image is generated, and a peripheral area arranged in a vicinity of the display area;

a first display element arranged in a first area of the display area, and a first pixel circuit connected to the first display element;

a second display element arranged in a second area of the display area;

a pixel circuit unit in which a second pixel circuit connected to the second display element in the peripheral area is arranged;

a scan driving circuit arranged in the peripheral area and connected to at least the first pixel circuit;

an organic insulating layer that is arranged between the first display element and the first pixel circuit, and extends to the peripheral area; and a valley portion that is provided as an opening in the organic insulating layer in the peripheral area, and at least partially surrounds the display area and the scan driving circuit in a plan view, wherein the valley portion includes a first valley and a second valley that are apart from each other on a side of the display area opposite a terminal unit, and wherein the first valley is disposed on one side of the pixel circuit unit and the second valley is disposed on the other side of the pixel circuit unit in a plan view.

9. The display panel of claim 8, further comprising a dam portion that is arranged in the peripheral area, and protrudes from an upper surface of the substrate, wherein the valley portion is arranged between the first area and the dam portion.

10. The display panel of claim 9, further comprising a common voltage driving line that is arranged in the peripheral area, and at least partially surrounds the display area, wherein the dam portion includes a first dam overlapping the common voltage driving line.

11. The display panel of claim 10, wherein the common voltage driving line includes a first common voltage driving line and a second common voltage driving line that are spaced apart from each other with respect to the pixel circuit unit-therebetween.

12. The display panel of claim 11, further comprising a driving voltage supply line that is arranged between the first common voltage driving line and the second common voltage driving line at one side of the pixel circuit unit.

13. The display panel of claim 12, wherein the first dam is arranged to cover one edge of the driving voltage supply line.

14. The display panel of claim 10, wherein the dam portion includes a second dam spaced apart from the first dam, and the second dam is arranged to cover an edge of the common voltage driving line.

15. The display panel of claim 14, wherein the dam portion comprises a third dam outside of the second dam, and a height of the third dam is less than a height of the second dam.

16. The display panel of claim 9, further comprising:

a fan-out line overlapping the dam portion; and a bridge line that is arranged on a different layer from a layer on which the fan-out line is arranged, and connects the fan-out line to the second pixel circuit.

17. The display panel of claim 8, wherein the organic insulating layer is provided by stacking a first organic insulating layer and a second organic insulating layer, and the pixel circuit unit includes a line disposed between the first organic insulating layer and the second organic insulating layer.

18. The display panel of claim 8, further comprising an inner dam at least partially overlapping the pixel circuit unit, wherein the inner dam is arranged on the organic insulating layer.

19. The display panel of claim 8, further comprising a transparent connection line that connects the second display element to the second pixel circuit, wherein the organic insulating layer is provided by stacking a first organic insulating layer and a second organic insulating layer, and the transparent connection line is arranged between the first organic insulating layer and the second organic insulating layer.

20. The display panel of claim 8, further comprising an inorganic insulating layer between the substrate and the organic insulating layer, wherein an opening corresponding to the second area is defined in the inorganic insulating layer, the opening being filled with the organic insulating layer.

21. A display panel comprising:

a substrate including a display area in which an image is implemented, and a peripheral area arranged in a vicinity of the display area;

a first display element arranged in a first area of the display area, and a first pixel circuit connected to the first display element;

an organic insulating layer that is arranged between the first display element and the first pixel circuit, and extends to the peripheral area;

a second display element arranged in a second area of the display area;

a pixel circuit unit which is arranged in the peripheral area, and in which a second pixel circuit connected to the second display element is arranged;

a scan driving circuit arranged in the peripheral area and connected to at least the first pixel circuit;

a dam portion that is arranged in the peripheral area, and protrudes from an upper surface of the substrate; and a valley portion provided as an opening of the organic insulating layer disposed between an edge of the display area and the dam portion wherein the valley portion extends between the scan driving circuit and the dam portion, wherein the valley portion includes a first valley and a second valley that are spaced apart from each other on a side of the display area opposite a terminal unit and wherein the first valley is disposed on one side of the pixel circuit unit and the second valley is disposed on the other side of the pixel circuit unit in a plan view.

22. The display panel of claim 21, further comprising a common voltage driving line that is arranged in the peripheral area, and at least partially surrounds the display area, wherein the dam portion includes a first dam overlapping the common voltage driving line.

23. The display panel of claim 22, wherein the common voltage driving line includes a first common voltage driving line and a second common voltage driving line that are spaced apart from each other with the pixel circuit unit therebetween.

24. The display panel of claim 23, further comprising a driving voltage supply line that is arranged between the first common voltage driving line and the second common voltage driving line at one side of the pixel circuit unit.

25. The display panel of claim 24, wherein the first dam is arranged to cover one edge of the driving voltage supply line.

* * * * *